(12) United States Patent
Sato et al.

(10) Patent No.: US 6,973,226 B2
(45) Date of Patent: Dec. 6, 2005

(54) OPTOELECTRONIC WAVEGUIDING DEVICE AND OPTICAL MODULES

(75) Inventors: Hiroshi Sato, Kokubunji (JP); Akira Taike, Kokubunji (JP); Kazunori Shinoda, Tokorozawa (JP); Shinji Tsuji, Hidaka (JP)

(73) Assignee: Hitachi, Ltd., Tokyo (JP)

( * ) Notice: Subject to any disclaimer, the term of this patent is extended or adjusted under 35 U.S.C. 154(b) by 235 days.

(21) Appl. No.: 10/614,779

(22) Filed: Jul. 9, 2003

(65) Prior Publication Data

US 2005/0078904 A1 Apr. 14, 2005

Related U.S. Application Data

(62) Division of application No. 09/916,286, filed on Jul. 30, 2001, now abandoned.

(30) Foreign Application Priority Data

Apr. 26, 2001 (JP) .................................. 2001-129178

(51) Int. Cl.[7] .................................................. G02B 6/12
(52) U.S. Cl. ........................................... 385/14; 385/40
(58) Field of Search ........................... 385/4–10, 14, 385/40, 41; 257/93, 98

(56) References Cited

U.S. PATENT DOCUMENTS

| | | | |
|---|---|---|---|
| 4,755,015 A | * | 7/1988 | Uno et al. .................. 385/131 |
| 4,840,446 A | | 6/1989 | Nakamura et al. ............. 62/474 |
| 5,572,616 A | | 11/1996 | Aoki et al. ................... 385/131 |
| 5,574,289 A | | 11/1996 | Aoki et al. .................... 257/17 |
| 6,343,163 B1 | | 1/2002 | Kawanishi ...................... 385/2 |
| 6,472,682 B1 | * | 10/2002 | Kuramoto ...................... 257/14 |
| 2002/0057483 A1 | | 5/2002 | Miyazaki ..................... 359/248 |

OTHER PUBLICATIONS

Seung Won Lee, Jeong Soo Kim, Eun Soo Nam, Chan Yong Park, Chong Dae Park, Hong Man Kim and Kwang Eui Pyun, "Growth of Defect–free Butt–coupled InGaAsP/InGaAsP Strain Compensated Multiple Quantum Well by Metal–Organic Vapor Phase Epitaxy," Optoelectronics Section, Electronics and Telecommunications Research Institute Yusong, pp. 189–190 (May 2001).

* cited by examiner

*Primary Examiner*—Huy Mai
(74) *Attorney, Agent, or Firm*—Reed Smith LLP; Stanley P. Fisher, Esq.; Juan A. Marquez, Esq.

(57) ABSTRACT

An optical transmission device suitable for a high-speed and large-capacity optical transmission system. An optoelectronic waveguiding device including an optical waveguide layer and cladding layers each having a larger band gap than that of the optical waveguide are deposited above and beneath the optical waveguide layer formed on a semiconductor substrate. The waveguide and cladding layers comprise optical waveguides each having a MQW structure in a direction of a light propagation axis of the optical waveguide layer. Among these optical waveguides, there exists first and second optical waveguides, whose layer structures may be mutually different. The optoelectronic waveguiding device maybe characterized in that an optical waveguide made of a bulk crystal exists in a connection part between the MQW structure waveguides each having a different layer structure. The specific connected optoelectronic waveguiding device elements may include semiconductor lasers, modulators and/or amplifiers.

5 Claims, 21 Drawing Sheets

OPTOELECTRONIC WAVEGUIDING DEVICE AND OPTICAL MODULES

This application is a divisional application of U.S. application Ser. No. 09/916,286 filed on Jul. 30, 2001 now abandoned.

PRIORITY TO FOREIGN APPLICATIONS

This application claims priority to Japanese Patent Application No. P2001-129178.

BACKGROUND OF THE INVENTION

1. Field of the Invention

The present invention relates to integrated semiconductor optical devices, and more specifically, the present invention relates to semiconductor optoelectronic waveguiding devices including an optical waveguide comprising a plurality of multiple quantum wells and to optical modules utilizing such devices.

2. Description of the Background

With the recent increase in the use of information and communication services, optical communication systems that support such services with higher speeds and increased capacity are desired. For example, optical transmission apparatuses for optical communication of a trunk line in which a plurality of communication lines are bundled should support high-speed (10 Gbit/s class) and long-distance transmission. Consequently, a semiconductor laser capable of operating at a transmission speed as high as at least 10 Gbit/s is preferred as the light source to be built into such optical transmission apparatuses.

A promising light source that enables high-speed, long-distance transmission whose speed is equal to at least 10 Gbit/s is a laser device manufactured by integrating an EA (electro absorption) type optical modulator and a DFB (distributed feedback) semiconductor laser on a single substrate ("EA/DFB laser"). Because the operating principles and availability of the EA/DFB laser are known, a detailed explanation is omitted and only the basic structure, advantages, and potential disadvantages thereof will now be described.

In the EA/DFB laser, areas of the DFB laser and of the EA modulator are monolithically formed on the same semiconductor substrate. In general, a multiple quantum well (MQW) structure of the laser and that of the modulator are formed to have different materials, compositions, layer thicknesses, and other properties so that an energy gap of the MQW layer of the modulator part is larger than that of the MQW layer of the laser part. Typical methods whereby the MQW structures having mutually different energy gaps are formed on the same semiconductor substrate include (1) a selective area growth method and (2) a butt-joint formation method.

Each of these methods has known advantages and disadvantages. In order to make full use of the EA/DFB laser in high-speed optical communication systems (such as a transmission system whose transmission speed is equal to at least 10 Gbit/s), it is preferable to design both the EA modulator and the DFB laser to have an optimal structure independently so that each of these can exploit its own full potential.

In the case where the EA/DFB laser structure is formed by the selective area growth method, the modulator and the laser may be formed by single crystal growth; this method has the advantage of a simple manufacturing process. However, the materials, the compositions, and the total numbers of layers of the laser part and of the modulator are inevitably the same, and the method has little or no room for independent optimization of these device elements.

On the other hand, using the butt-joint formation method, the laser part and the modulator can be formed by independent processes. Therefore, the modulator and the laser may be optimized independently in terms of their materials, compositions, layer thicknesses, the numbers of layers, and other properties. For 10 Gbit/s-and-higher high-speed and long-distance transmission, where both the modulator and the laser part preferably each achieve high end characteristics respectively, integration of the modulator and the laser by the butt-joint method appears promising.

SUMMARY OF THE INVENTION

When the butt-joint method is adopted, a laser having the optical modulator integral therewith is generally formed through the following processes. (1) First, a device element structure of the DFB laser is formed on a semiconductor substrate. (2) The DFB laser area is protected with a dielectric film such as silicon oxide or silicon nitride. (3) Next, using the above-mentioned dielectric film as a mask, the MQW layer in the DFB laser area is selectively etched away to expose the semiconductor substrate. (4) On the exposed semiconductor substrate, a MQW structure that is desired for use as the EA modulator and that will act as an absorption layer ("EA-MQW") is re-grown.

In the growth process of the EA-MQW, because a feed rate of growth species exceeds the normal feed rate (by a factor ranging from zero to a few tens of $\mu$m) in the vicinity of the dielectric mask covering the DFB laser area, the well layers and barrier layers of the MQW layer become thicker and the absorption edge of the MQW layer moves toward a longer wavelength. Additionally, it is known that the crystal quality of the EA-MQW layer in this area decreases. Details of this phenomenon have been reported, for example, in the conference proceeding of IEEE lasers and electro-optics society, 9th annual meeting, WY2, p. 189.

In the above-mentioned example, a crystal defect whose absorption edge has moved to a longer wavelength and whose crystal quality has deteriorated easily absorbs light that propagates from the DFB laser part to the EA modulator. Therefore, problems may be caused such as (a) a reduction in the optical output of the device and (b) the generation of unnecessary carriers in the EA modulator area. Similar problems were referred to, for example, in Japanese Patent Application Laid-Open No. 8-335745. These potential problems are preferably addressed when the butt-joint formation is used.

In at least one preferred embodiment, the present invention provides a semiconductor optoelectronic waveguiding device with as small an optical loss as possible in the optical waveguide and that can respond to high-speed modulation that is desired for high-speed transmission. The present invention may also provide a semiconductor optoelectronic waveguiding device that is manufactured by integrating device elements of the optical modulator and the semiconductor laser, each of which is optimized in terms of several characteristics thereof.

In at least preferred embodiment, the basic structure of the present invention comprises an optoelectronic waveguiding device having at least two optoelectronic device element parts each comprising an optical waveguide. The optical waveguides possessed by the above-mentioned at least two optoelectronic device element parts are preferably connected to each other with an optical waveguide such that at least a core portion thereof is made of a bulk crystal. In this case, it may be convenient to form the above-mentioned at least two optoelectronic device element parts on a single substrate, for example, a semiconductor substrate.

Examples of the above-mentioned at least two optoelectronic device element parts may include: a semiconductor laser part; an optical modulator part; and an optical amplifier part. Further, optical device elements other than these enumerated device elements may be used as the need arises. Moreover, in accordance with particular embodiments of the optoelectronic waveguiding device of the present invention, a configuration in which a plurality of pairs each having two of these optical device elements are arranged side by side may be adopted.

To achieve the maximum performance of the EA/DFB laser, the present invention preferably comprises a structure such that the crystal defect between the DFB laser and the EA modulator is removed and a waveguide whose optical absorption is extremely low is inserted into this area. Consequently, the basic structure according to at least one embodiment of the present invention includes an optical waveguide of a bulk crystal formed at a connection part between the MQW of the laser part and the MQW of the modulator part. The form according to the present invention may be a structure whose quantum effect is extremely small by using the above-mentioned bulk crystal area as the optical waveguide.

The MQW of the above-mentioned laser part to be connected to the MQW of the above-mentioned modulator part is preferably formed by a first butt-joint formation. The bulk crystal waveguide is then formed by a second butt-joint formation so as to have a desirable refractive index distribution.

It should be noted that it is preferable to establish an optical connection between the optical modulator and the laser part with the optical waveguide in the present invention.

Thus, by adopting the optical waveguide made of a newly-formed bulk crystal, the present invention preferably realizes the one or more of the following: (1) the optical absorption can be reduced as low as possible by suppressing the shifting of the absorption edge that may occur in the MQW structure and (2) a further decrease in the optical absorption and improvement of the reliability of the device may be achieved by not providing a crystal defect of poor crystallinity in the device.

BRIEF DESCRIPTION OF THE DRAWINGS

For the present invention to be clearly understood and readily practiced, the present invention will be described in conjunction with the following figures, wherein like reference characters designate the same or similar elements, which figures are incorporated into and constitute a part of the specification, wherein.

DETAILED DESCRIPTION OF THE INVENTION

Figure 1:
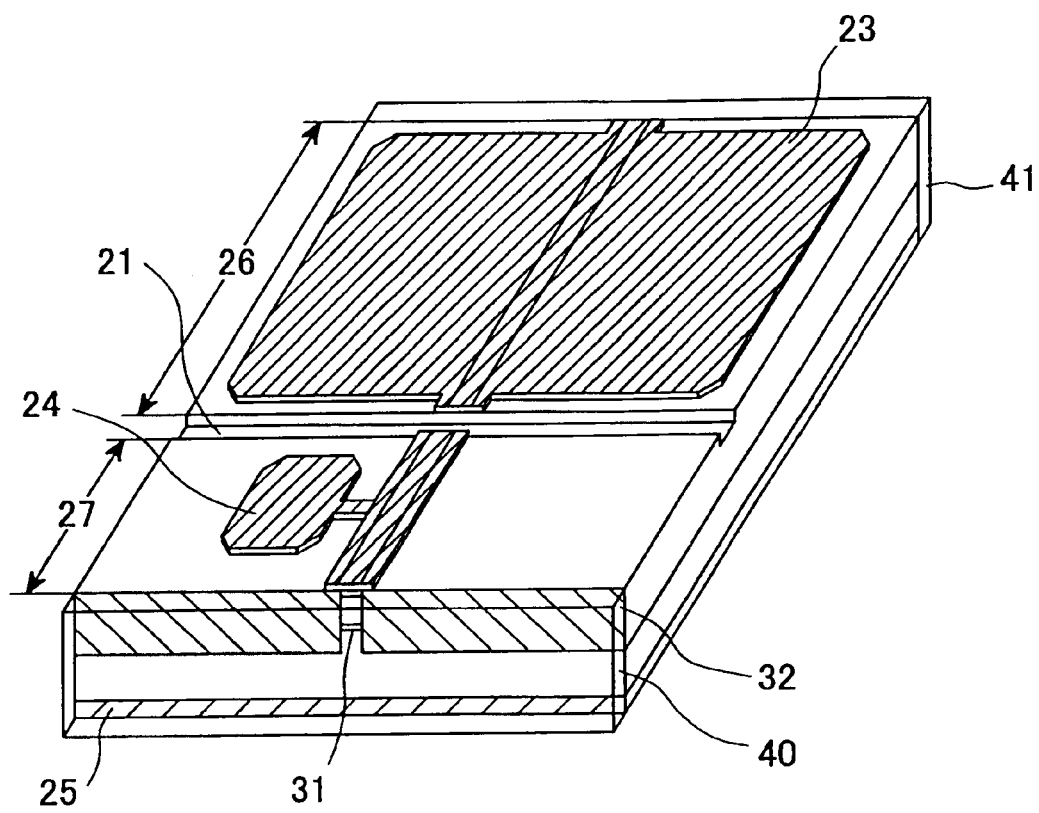
FIG. 1 is a perspective view of a device according to a first embodiment of the present invention.

It is to be understood that the figures and descriptions of the present invention have been simplified to illustrate elements that are relevant for a clear understanding of the present invention, while eliminating, for purposes of clarity, other elements that may be well known. Those of ordinary skill in the art will recognize that other elements are desirable and/or required in order to implement the present invention. However, because such elements are well known in the art, and because they do not facilitate a better understanding of the present invention, a discussion of such elements is not provided herein. The detailed description will be provided hereinbelow with reference to the attached drawings.

Before the description of a concrete manner in which the present invention may be carried out, the effects that characterize the basic structure of the invention and a comparison between the structure of the optoelectronic waveguiding device according to the invention and that of the conventional optoelectronic waveguiding device will be further described in detail.

In preferred embodiments of the present invention, the above-mentioned crystal defect is removed, and hence, the absorption loss of light in the device is significantly reduced. Because the bulk crystal waveguide has no MQW structure, there may occur little shift of the bad-gap energy (absorption edge) in the vicinity of the mask pattern edge in this butt-joint formation process. Therefore, the absorption arising from the bulk crystal waveguide that is introduced into the structure is decreased significantly as compared to that of the original MQW structure.

By replacing the crystal in the crystal defect with a newly-grown crystal, the present invention may be differentiated from the methods in the above-mentioned Japanese Patent Application Laid-Open No. 8-335745. Note that, in the above-mentioned Japanese Patent Application Laid-Open No. 8-335745, the absorption edge of the crystal defect is shifted toward a shorter wavelength by ion implantation to achieve reduction in the absorption loss. In this case, although it is possible that the absorption edge is shifted, the crystal defect itself cannot be removed.

Contrary to this, in the present invention, because the crystal defect is preferably replaced with the optical waveguide of the bulk crystal, not only can the absorption edge be shifted from the absorption edge of the crystal having the crystal defect to a desired absorption edge, but also the crystal defect itself may be removed. By the removal of the crystal defect in the optical waveguide, additional effects such as an improvement in reliability of the device may also be expected. That is, the service life of an apparatus into which the present device is built may be improved. Further, according to the invention, it may also be possible to decrease the optical absorption in the optical waveguide as compared to the above-mentioned prior art.

Alternatively, if it is desired only to remove the above-mentioned crystal defect, it is also possible that the crystal defect is removed and subsequently the area is buried with the same material as the cladding layer. Actually, a structure such that a gap between the DFB laser and the EA modulator is buried with InP can be found, for example, in the Japanese Patent Application Laid-Open No. 7-193210. However, in this example, since the optical waveguide is broken between the DFB laser and the EA modulator, the light suffers radiation loss at the gap. The magnitude of the radiation loss is shown in FIG. 20.

Figure 20:
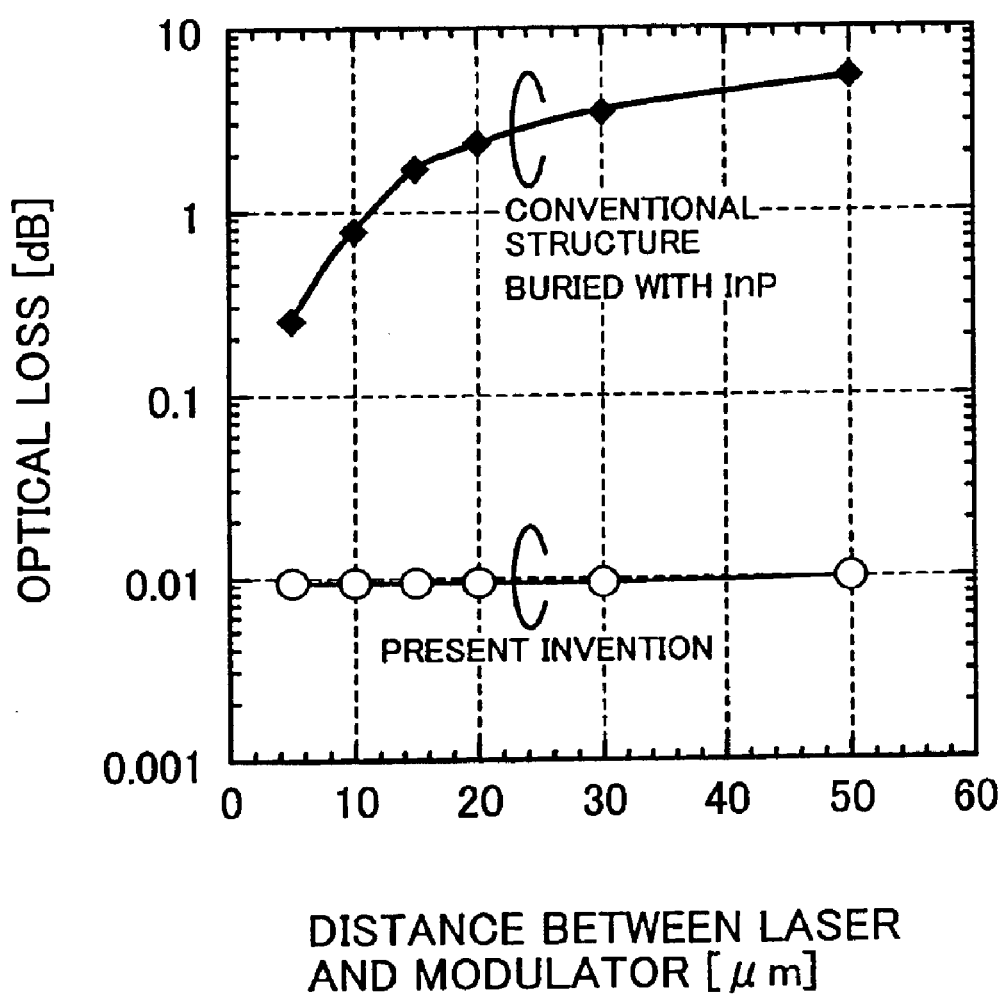
FIG. 20 illustrates the relation between radiation loss in the device and the distance between the laser part and the optical modulator.

FIG. 20 is a diagram showing a relation between the magnitude of the radiation loss and the distance between the optical modulator and the laser part. The horizontal axis denotes the distance between the optical modulator and the laser part; the vertical axis denotes the radiation loss in the device. In FIG. 20, the case where InP exists between the modulator and the laser part is marked with "buried with InP" and the case of the present invention is marked with "present invention." In the case of "buried with InP," it is shown that the radiation loss increases exponentially with an increase in distance between the modulator and the laser. When the EA modulator and the laser part are separated by at least a few tens of $\mu$m, there occurs a radiation loss equal to at least approximately 1 dB, and the loss may become a large obstacle to an increase of the optical output from the device.

Figure 21:
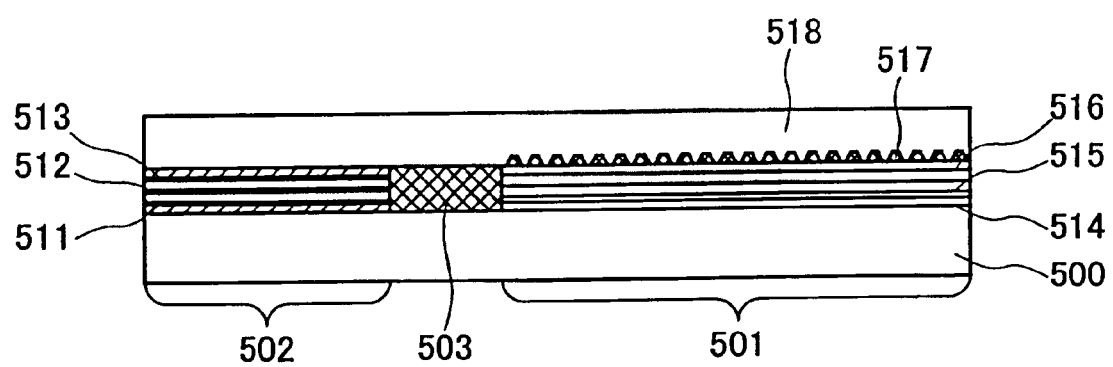
FIG. 21 is a cross section showing a basic concept of the present invention.

Contrary to this, with a structure such that an area where the crystal defect was removed is buried with a bulk crystal whose refractive index is preferable for guiding light, as is the case of the present invention, little optical radiation loss is generated between the laser part and the modulator. A schematic cross section of such a structure is shown in FIG. 21. FIG. 21 details a DFB laser part 501, tan optical modulator part 502, and an area of the optical waveguide of the bulk crystal formed by new crystal growth 503. As the laser part 501, a first optical confinement layer 514, an active layer 515, a second optical confinement layer 516, and a grating 517 are preferably formed on a semiconductor substrate 500. For the optical modulator part 502, a first optical confinement layer 511, an optical waveguide part 512, and a second optical confinement layer 513 are preferably formed. Thereafter, a second cladding layer 518 is formed over these two parts 501, 502.

Figure 22:
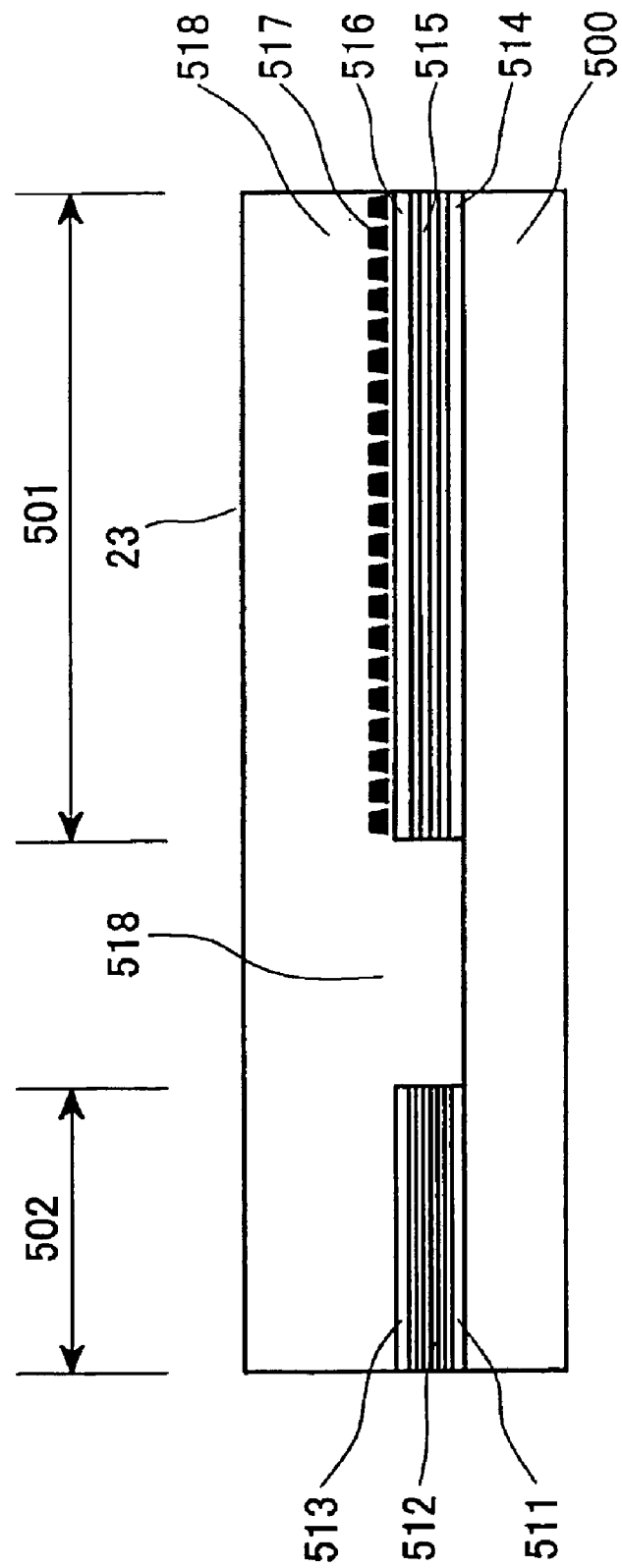
FIG. 22 is a cross section showing a comparative example where the same single crystal is used to bury a gap between the laser part and the optical modulator as well as the laser part and the modulator.

FIG. 22 is a cross section showing an example where an area of the crystal defect that existed between the optical modulator 502 and the laser part 501 is buried with a second cladding layer 518 by crystal growth. In this example, in a similar manner to the above-mentioned example of FIG. 21, the laser part includes a first light confinement layer 514, an active layer area 515, a second optical confinement layer 516, and a grating 517 are formed on the semiconductor substrate 500. The optical modulator includes a first optical confinement layer 511, an optical waveguide part 512, and a second optical confinement layer 513 formed on the substrate 500. Further, a second cladding layer 518 is again formed over these parts 501, 502. It should be noted in this example that a gap between the optical modulator 502 and the laser part 501 is buried with the second cladding layer 518.

Here, FIG. 21 and FIG. 22 are schematic, conceptual diagrams, and there may be many structural variants that can be carried out in manufacturing actual devices according to these diagrams.

According to the present invention, the loss may be reduced by at least an order of magnitude as compared to the structure illustrated in FIG. 22 where the gap between the modulator and the laser is buried with InP, and a structure suitable to increase the optical output of a device may be provided. This improvement may be more fully understood with respect to the comparison of characteristics shown in FIG. 20 and described above.

Therefore, it is preferred in the present invention to establish an optical connection between the optical modulator and the laser part with the optical waveguide of a bulk crystal. If the optical modulator and the laser part, which are placed with a gap, are connected using the same material as the cladding layer, one or more of the above desired effects may not be obtainable.

The present invention may be effective for semiconductor optoelectronic waveguiding devices, especially for semiconductor optoelectronic waveguiding devices that use compound semiconductor materials. Typical examples of semiconductor materials to be used for said semiconductor optoelectronic waveguiding devices include InGaAlAs, InGaAsP, and similar compounds. The MQW structure may be composed of one of these enumerated materials. In this case, one material selected from a group consisting of InGaAsP, InGaAlAs, and InAlAs is preferable for the bulk part for connecting these MQW structures. Generally speaking, InP is used as the substrate for various device applications.

Further, this invention may be effective for optoelectronic waveguiding devices that use compound semiconductor materials containing N. In other words, the optoelectronic waveguiding device may use an InGaNAs system compound semiconductor material as a material for the MQW structure formed on a GaAs substrate.

First Exemplary Embodiment

A first exemplary embodiment of the present invention as applied to a semiconductor laser device into which a 1.55 μm band EA modulator is integrated ("EA modulator integrated semiconductor laser device") will now be described. The feedback of light in the present laser may be achieved by distributed feedback (DFB).

Figure 2:
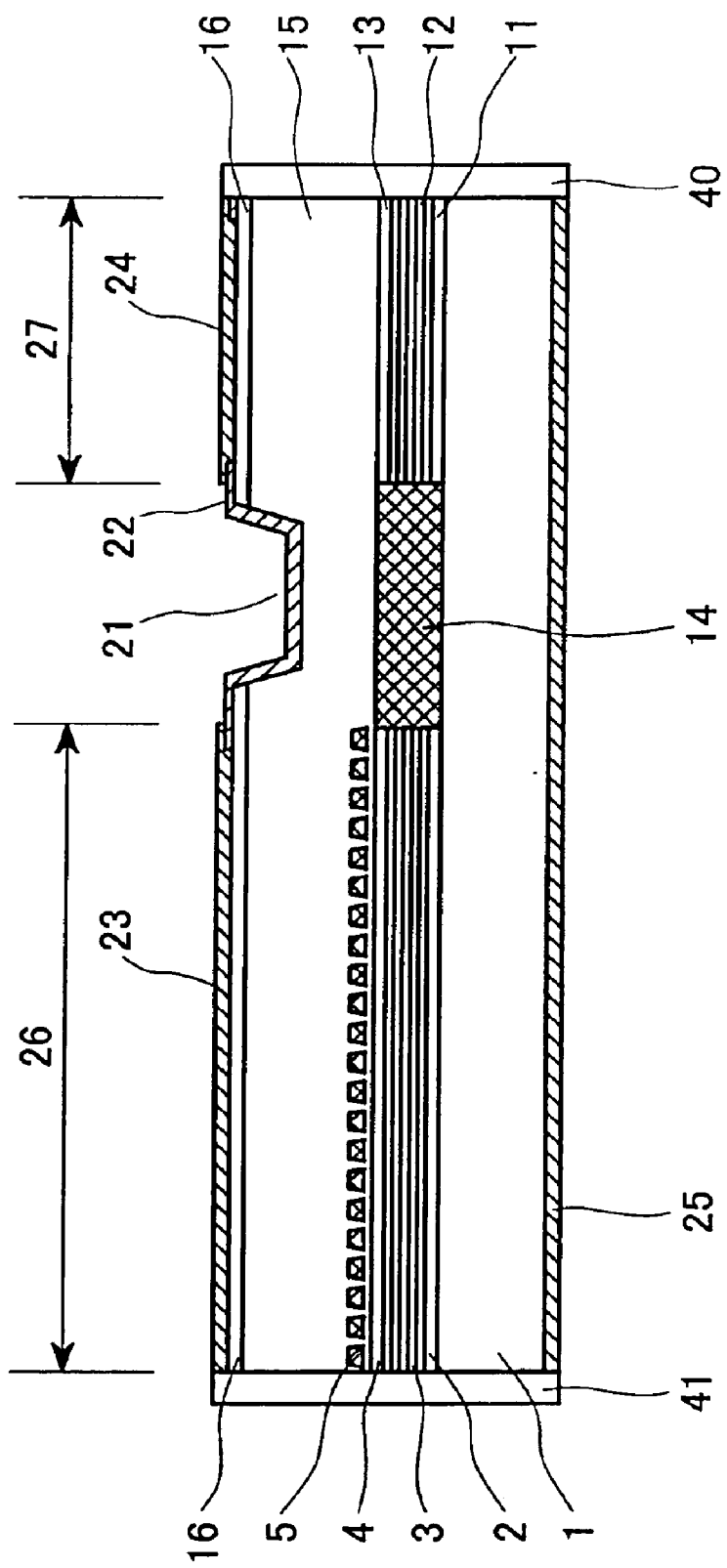
FIG. 2 is a cross section of a device according to the first embodiment of the present invention, taken along a plane parallel to the travelling direction of light therein.
Figure 3:
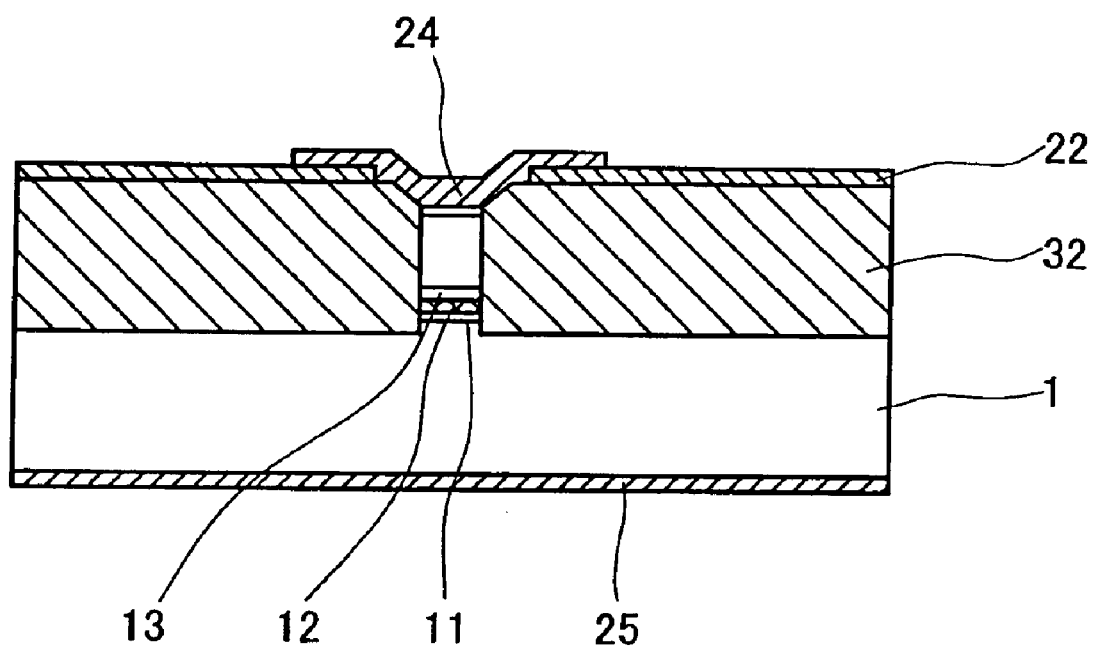
FIG. 3 is a cross section of a device according to the first embodiment of the present invention, taken along a plane intersecting the travelling direction of light therein.

FIG. 1 is a perspective view of a first exemplary embodiment according to the present invention, and FIG. 2 is a cross section of the optical waveguide part taken along a plane parallel to the travelling direction of light therein. FIG. 3 is a cross section of the device taken along a plane intersecting the travelling direction of light therein, and FIG. 4 illustrates cross sections of the device during various stages of the manufacturing process.

As shown in FIG. 1, the device is comprised of two device elements, a laser part 26 and a modulator 27. A laser electrode 23 and a modulator electrode 24 were formed independently. Between the laser part 26 and the modulator 27, a groove 21 is preferably formed for electrically isolating both device elements 26, 27. An optical waveguide part 31 of the device is formed as a stripe shape with a buried hetero (BH) structure as is generally known in the art. In this example, the sides of the stripe optical waveguide in the buried hetero structure are preferably buried with an Fe-doped high-resistance InP 32 (see FIG. 3).

The cross section of a layered structure in the present embodiment is shown in FIG. 2. In order to optimize the device characteristics, each of the laser part 26 and the EA modulator part 27 is of an optimal structure independently. Therefore, each element has a different layered structure. However, the substrate is preferably common to both device elements and is a compound semiconductor substrate made of, for example, n-type InP 1.

The laser part 26 preferably comprises an n-type InGaAsP optical confinement layer 2, a strained MQW layer 3, and a p-type InGaAsP optical confinement layer 4. The MQW layer, that will act as the active layer region, may consist of seven pairs (cycles) of a 6 nm thick well layer and a 10 nm thick barrier layer which are deposited sequentially, with the intention of achieving sufficient characteristics as a laser. A grating layer 5 made of an InGaAsP material exists on top of these layers. The active layer region and a structure of the grating layer may be formed so that the emission wavelength of the DFB laser at room temperature (25 degree C.) is approximately 1550 nm.

The optical confinement layers provided to sandwich the MQW layer are layers for enhancing the optical confinement of the above-mentioned MQW layer. The optical waveguiding function is effected by sandwiching the core region with cladding layers whose refractive indexes are lower than that of the core region. That is, the optical waveguiding function is achieved by a layered structure of cladding layer/MQW layer/cladding layer.

More concretely, the optical confinement layers sandwiching the MQW layer are provided to further enhance the optical confinement in the MQW layer. Therefore, the refractive indexes of the cladding layers are set to be lower than the refractive indexes of the above-mentioned optical confinement layers. Thus, the optical waveguiding function is preferably enhanced by the layered structure of the cladding layer/optical confinement layer/MQW layer/optical confinement layer/cladding layer. A form may also be adopted in which the cladding layer of the substrate side is the substrate itself. It may also be possible to provide the cladding layer of the substrate side independently on the semiconductor substrate.

The polarity of the grating layer 5 may be either n type or p type. In the case of p type polarity, the DFB laser preferably becomes a refractive index coupling type where only the refractive index varies periodically in the propagation direction of light. Alternatively, the n-type grating polarity gives rise to a gain coupling type DFB laser. The reason being that the grating functions as a periodically varying current-blocking layer, as is well known in the art. Therefore, not only the refractive index but also the gain in the active layer suffers periodic changes. In the present embodiment, a grating that was uniformly formed over the whole area of the DFB laser is described. However, there may also be provided a so-called "phase-shifted grating" where a period (phase) of the grating is shifted in a partial area thereof with respect to the remainder.

On the other hand, the EA modulator area 27 is preferably comprised of an n-type InGaAsP optical confinement layer 11, an undoped optical absorption layer 12, and an undoped InGaAsP optical confinement layer 13. For improved performance of the EA modulator, the optical absorption layer 12 may be formed of an InGaAsP system strained multiple quantum well (strained MQW) structure. The thickness of a quantum well is preferably set at approximately 7 nm, and the thickness of a barrier layer is set at approximately 5 nm. These layers may be deposited for 10 cycles. T barrier layer in the modulator part is preferably thinner than its counterpart in the laser part because the drift of the carriers is facilitated in the absorption layer to improve the modulation characteristics.

To remove the crystal defect that develops in the connection part between the laser and the modulator, an InGaAsP optical waveguide layer may be formed in this area by butt-joint formation. An exemplary method of forming the waveguides of the modulator part and the butt-joint waveguide layer will now be described with reference to FIG. 4.

Figure 4A:
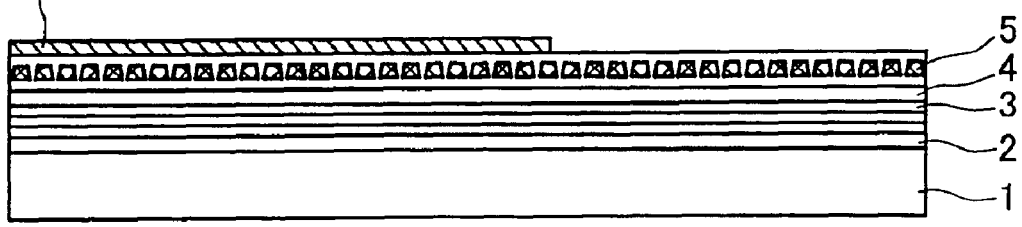
FIG. 4 shows cross sections of a device according to the first embodiment of the present invention, illustrating a manufacturing process in a processing order.

Initially, to form the laser structure, an n-type InGaAsP optical confinement layer 2, a strained MQW layer 3, and a p-type InGaAsP optical confinement layer 4 are preferably deposited on an n-type InP substrate 1. On top of these layers, a layered structure including the grating layer 5 made of an InGaAsP system material is thereafter formed (FIG. 4A).

Figure 4B:
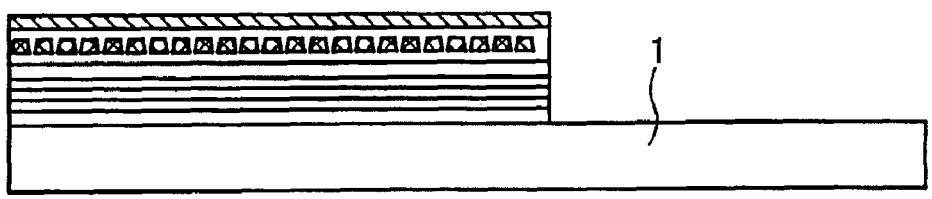

Silicon nitride ("SiN") is coated on the semiconductor wafer having the above layered structure and is shaped to be a protection mask 51 on the laser part. Using this SiN mask 51 that covers the laser part area, a grating layer 5 and the active layer region in the other area are etched away, as shown in FIG. 4B. The etching proceeds through the n-type InGaAsP layer 2 and is selectively stopped at the n-type InP substrate 1. The etching process may be selected from: a dry etching process such as reactive ion etching (RIE); a selective wet etching process using a solution whose main constituent is phosphoric acid or sulfuric acid; and a combination of both of these processes.

Figure 4C:
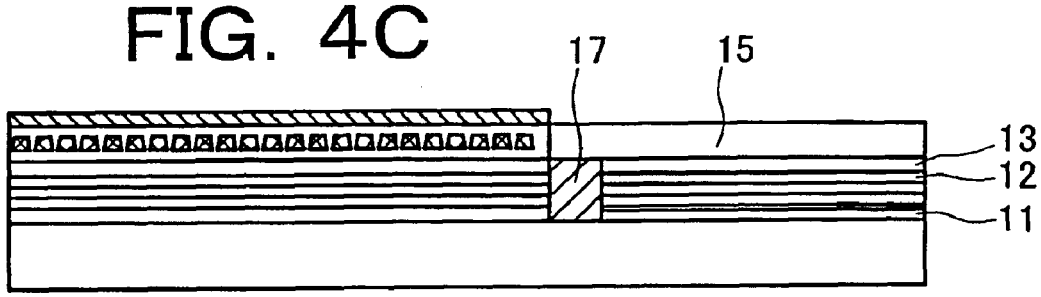
Figure 4D:
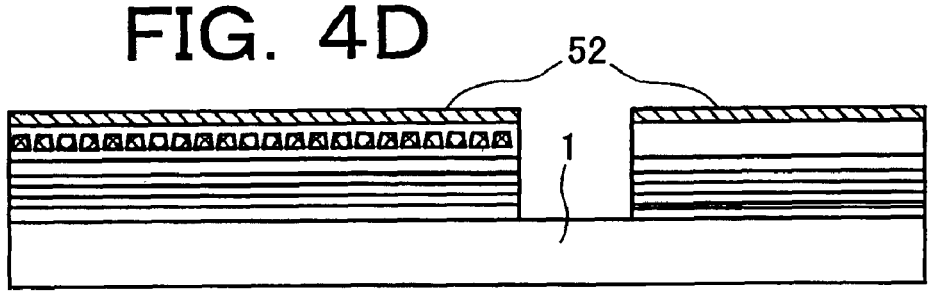

On the n-type InP substrate 1 that was exposed by the above-mentioned selective etching, an absorption layer area of the EA modulator is formed by a first butt-joint process (FIG. 4C). The absorption layer area is preferably formed by sequentially depositing an n-type InGaAsP optical confinement layer 11, a MQW optical absorption layer 12, a p-type optical confinement layer 13, and a p-type InP cladding layer 15.

The strained-MQW layer 12 may be comprised of ten cycles of a 7 nm thick quantum well layer and a 5 nm thick barrier layer. The absorption edge thereof is designed to be approximately 1490 nm. To achieve improved modulation characteristics, crystal compositions of the quantum well and of the barrier well are preferably chosen so that the former is given with compression strain whereas the latter is given with tensile strain.

During this first butt-joint process, when the MQW layer of the EA part is formed, a crystal defect 17 with poor crystallinity is also formed in the vicinity of the protection mask 51 in the laser part. In the crystal defect area 17, crystallinity is bad and the absorption edge of the MQW has shifted to the longer wavelength side.

Figure 5:
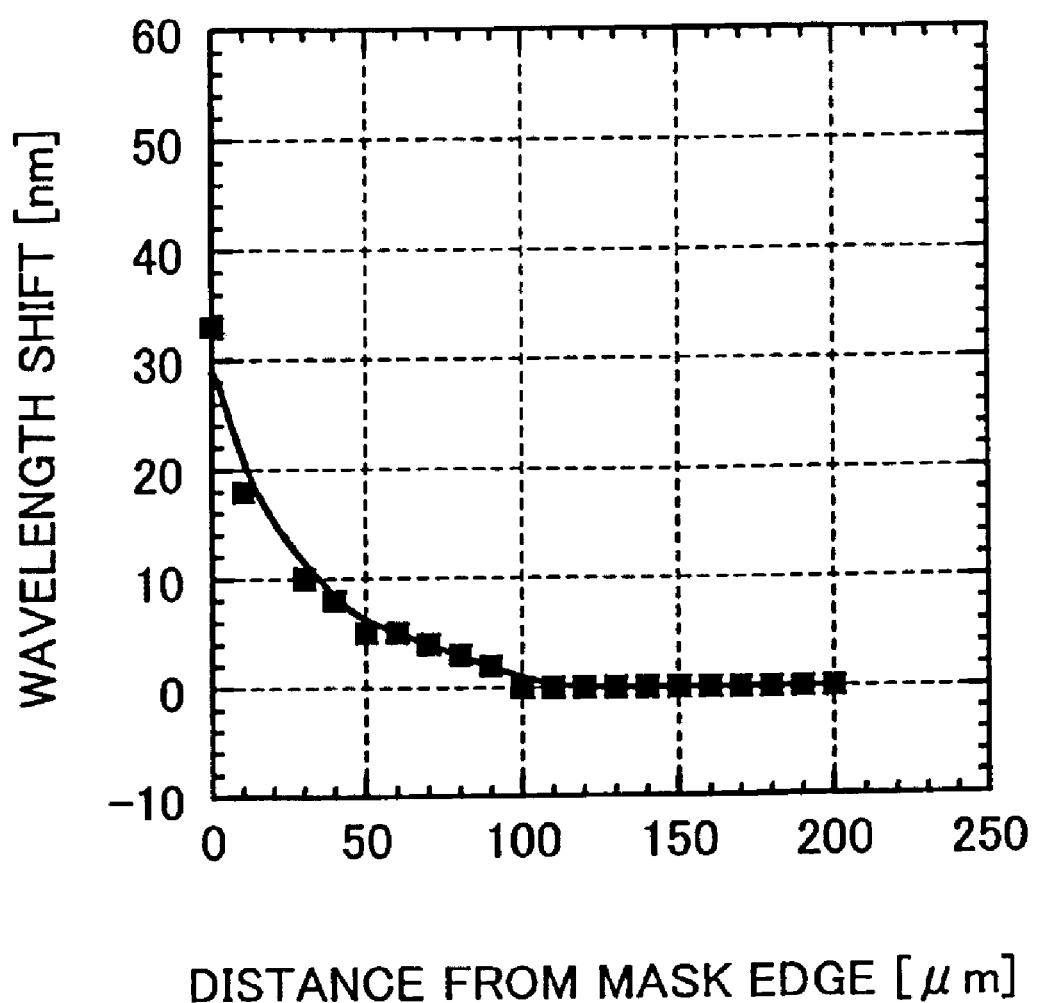
FIG. 5 is a characteristic diagram illustrating the shift of the absorption edge in a crystal defect of poor crystallinity.

FIG. 5 shows an example of a shift amount of the absorption edge of the EA part when the EA part is grown with the butt-joint method. The horizontal axis denotes the distance from the edge of the protection mask in the laser part, and the vertical axis denotes the shift amount of the absorption edge of the EA modulator part. In this example, the shift of the absorption edge is caused in the area adjacent to the protection mask in the laser part within the range of at least approximately 100 μm from a mask edge, and the wavelength shift of the absorption edge is larger as the distance from the protection mask in the laser part decreases. At the closest proximity to the mask, the absorption edge has moved to the longer wavelength side by as much as about 30 nm.

Figure 4E:
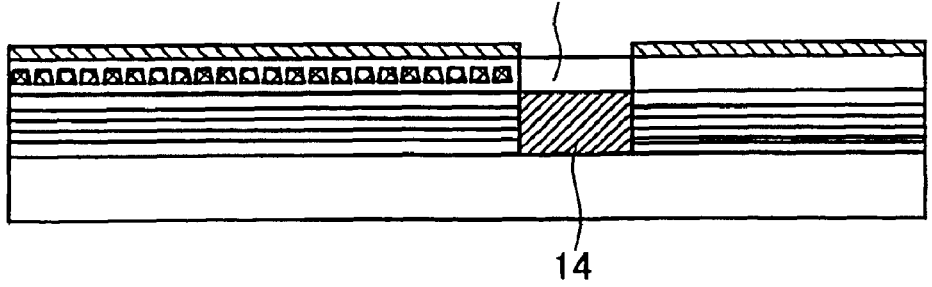

In order to remove this crystal defect 17, a mask 52 that has an opening only in the vicinity of the crystal defect (FIG. 4D) is formed, and the crystal defect is removed for a length of about 50 μm. Also in this process, in a similar manner to the first butt-joint process, the etching is selectively stopped at the surface of the n-type InP substrate 1. Subsequent to this etching, an optical waveguide layer 14 preferably made of undoped InGaAsP and an undoped InP layer 18 are deposited thereon (FIG. 4E).

After the optical waveguide structure is formed according to the above-mentioned procedure, the p-type InP cladding layer 15 and a p-type InGaAs layer 16 may be formed. An exemplary process for growing these crystals uses a metalorganic chemical vapor deposition (MOCVD) method. Further, the p-type InGaAs layer 16 may be formed to obtain an ohmic contact when the electrode is to be formed. An exemplary process for growing the above-mentioned crystal uses a metal organic vapor phase epitaxy (MOVPE) method. It should be noted in the cross section of FIG. 3 that numerals for the p-type InP cladding layer 15 and the p-type InGaAs layer 16 on the layer 13 are omitted.

Following the above-mentioned crystal growth process, a buried hetero (BH) structure is preferably formed by a process of forming a mesa stripe through a normal dry etching process and a further process of regrowing a burying layer by the MOVPE method. Here, the BH structure is a structure where both sides of an optical waveguide, as viewed from the travelling direction of light, are buried with a material capable of confining the light. The confining material normally is characterized by a high resistance. For the burying layer in this example, a high-resistance InP 32 was used and Fe was doped therein to increase its resistivity.

FIG. 3 is a cross section of the BH laser part taken along a plane intersecting the travelling direction of light therein. FIG. 3 may facilitate a better understanding of the BH structure. Following this process, the wafer surface is insulated with silicon oxide ("$SiO_2$") 22 and the p-side electrode 24 and an n-side electrode 25 are then formed. Moreover, on a front facet and on a rear facet of the device, a low-reflection coating 40 and a high-reflection coating 41 are formed, respectively (see e.g., FIG. 2).

Figure 6:
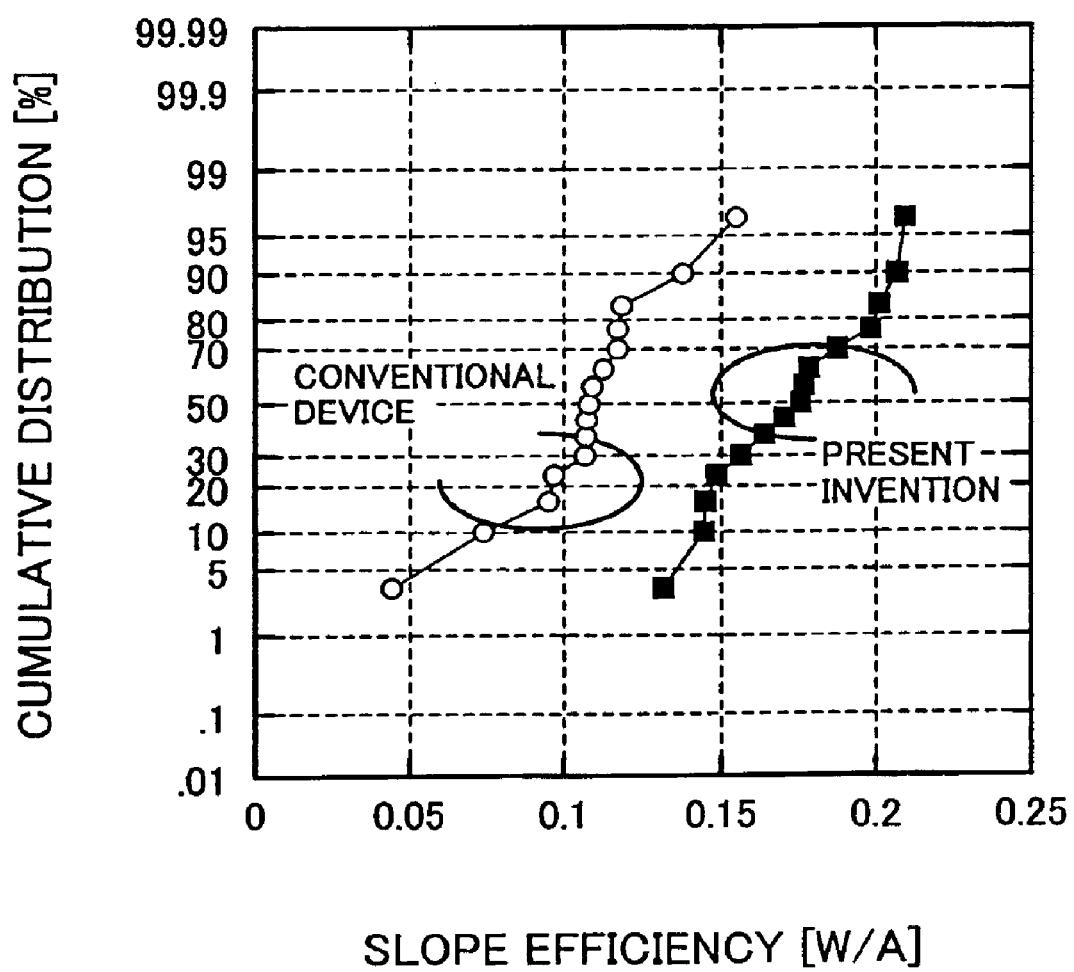
FIG. 6 is a diagram in which cumulative distributions of slope efficiency for the present invention and for the conventional example are shown for comparison.

To aid in the understanding of the effect on a device according to the present invention, a distribution of optical output efficiency per unit current (slope efficiency) obtained by evaluating the optical output versus current characteristics of exemplary devices is shown in FIG. 6. The horizontal axis of FIG. 6 denotes the slope efficiency, and the vertical axis denotes the cumulative distribution for the measured samples. FIG. 6 also shows the cumulative distribution of slope efficiency for devices that the present invention was not applied to (conventional device) and hence have crystal defects at the connection parts between the laser part and the modulator.

In FIG. 6, a group of solid squares designates samples according to the present invention, and a group of open circles designates samples of conventional devices. About 95 percent of the conventional devices are distributed below a slope efficiency of approximately 0.15 W/A. By contrast, less than about 25% of the devices according to the present invention have a slope efficiency of 0.15 W/A or less. Further, focusing on the center value of the distribution corresponding to 50 percent of the probability distribution, the devices according to the present invention improved the center value (almost equivalent to the average value) of the slope efficiency by a factor of about 1.3 (2 dB) over the conventional devices. One reason for this changes is that because the devices of the present invention have no crystal defect in the optical waveguides, the absorption loss in the waveguide is reduced to an extremely small value as compared to the conventional butt-joint method.

Second Exemplary Embodiment

Figure 7:
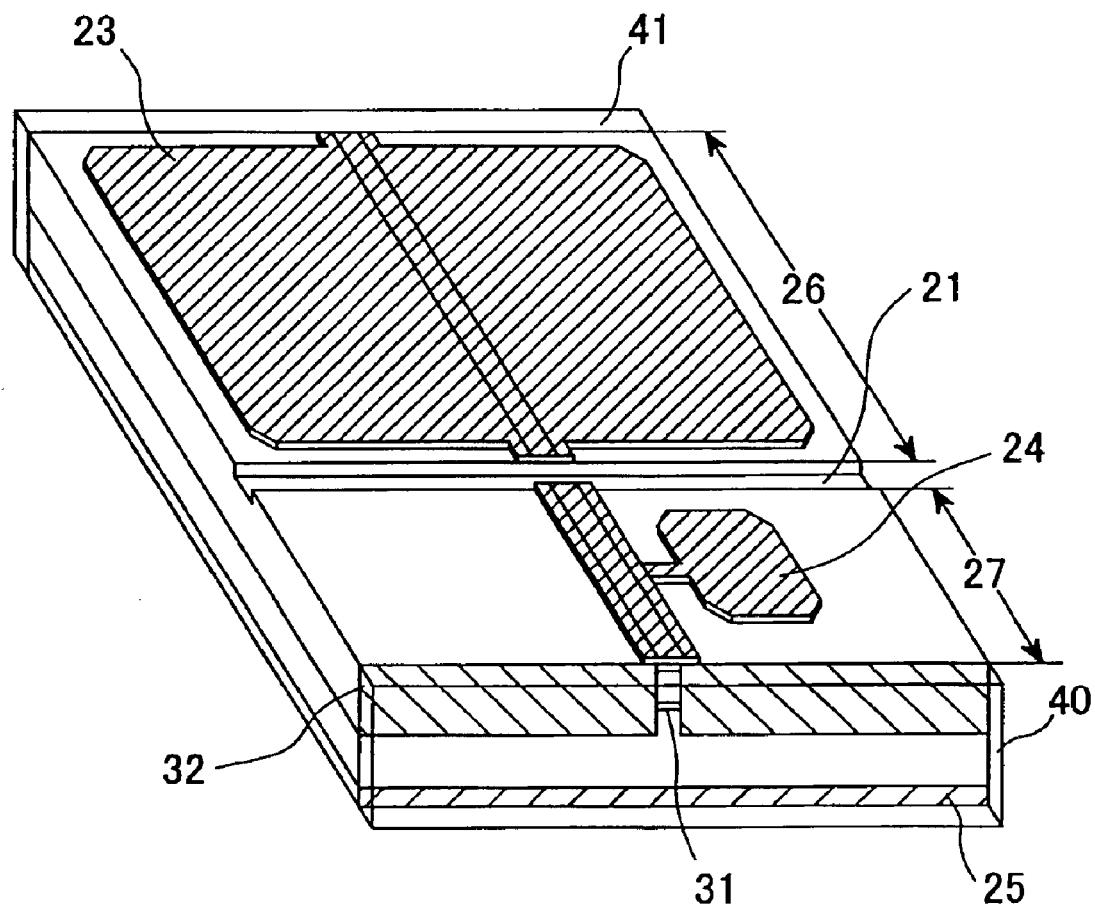
FIG. 7 is a perspective view of a device according to a second embodiment of the present invention.
Figure 8:
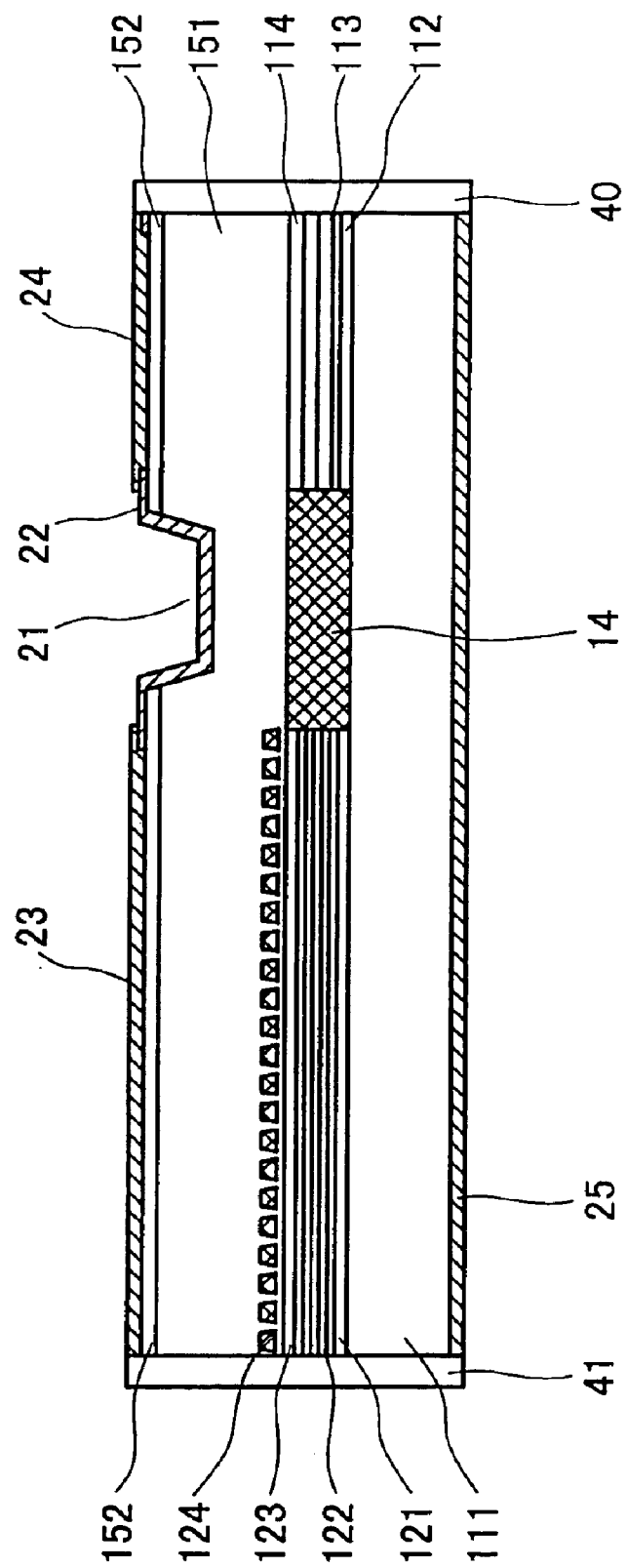
FIG. 8 is a cross section of a device according to the second embodiment of the present invention, taken along a plane parallel to the travelling direction of light therein.
Figure 9:
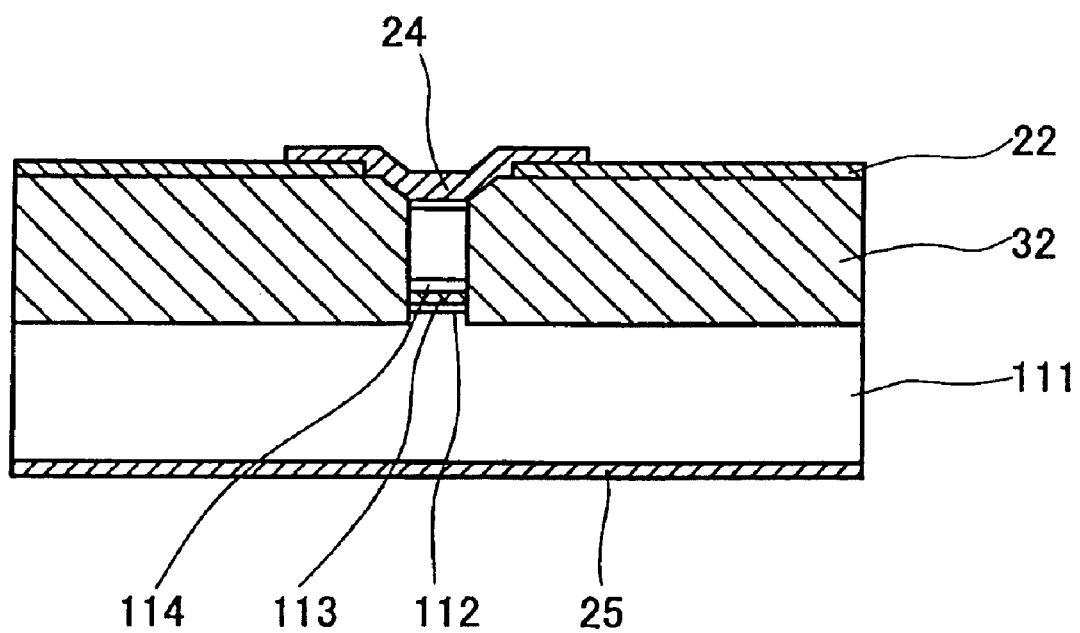
FIG. 9 is a cross section of a device according to the second embodiment of the present invention, taken along a plane intersecting the travelling direction of light therein.

FIG. 7 though FIG. 9 show devices according to a second exemplary embodiment of the present invention. FIG. 7 is a perspective view of a device of the second embodiment, and FIG. 8 is a cross section of the waveguide part of the device taken along a plane parallel to the travelling direction of light therein. FIG. 9 is a cross section of the device taken along a plane intersecting the travelling direction of light therein, and FIG. 10 shows cross sections illustrating an exemplary manufacturing process of the device.

This embodiment is preferably characterized in that the EA modulator part 27 is comprised of an InGaAlAs system MQW. The laser part 26 is formed with an InGaAsP system MQW in a similar manner to the first exemplary embodiment. There is a groove 21 that separates these MQW structures. As best seen in the perspective view of FIG. 7, the present exemplary embodiment has a basic configuration similar to that described with respect to the first embodiment. A detailed explanation for the similar features in the figures is omitted.

It is known that an EA modulator that uses an InGaAlAs system material has improved modulation efficiency and may achieve a larger extinction ratio than one that uses an InGaAsP system MQW. The extinction ratio is a parameter which shows the ratio of the light outputs for ON and for OFF of the optical signal. In general, larger the extinction ratio are preferred for the transmission of light signals. Therefore, for an optical transmission system that requires a larger extinction ratio, the laser having the EA modulator made of the InGaAlAs system MQW integral therewith, as described in this embodiment, may be suitable. Hereafter, an exemplary manufacturing process for the laser will be described with reference to FIG. 10.

The growth temperature of the InGaAlAs system material to be used for the EA modulator part in this embodiment is higher than the growth temperature of the InGaAsP system material to be used for the laser part. Therefore, if the MQW of the laser part is formed first, that MQW will be exposed to an elevated temperature above the growth temperature of the laser. When the laser part undergoes such a thermal hysteresis, minute defects in the crystals that constitute the MQW of the laser part move easily to easily effectuate a degradation of the crystals, and these defects cause a deterioration of the device characteristics. To circumvent this potential problem, the InGaAlAs-system MQW that requires the high temperature is preferably grown first in the present embodiment of the invention.

The optical absorption layer preferably comprises: an n-type InGaAlAs optical confinement layer 112; an MQW layer 113; and an undoped InGaAlAs optical confinement layer 114 formed on an n-type InP substrate 111. The MQW layer 113 may be manufactured by depositing a quantum well layer (thickness approximately 7 nm) and a barrier layer (thickness approximately 5 nm), both of which consist of the InGaAlAs system material, for ten cycles. On this optical absorption layer, a cladding layer of a p-type InP 115 is grown to a thickness of approximately 0.2 μm.

Figure 10A:
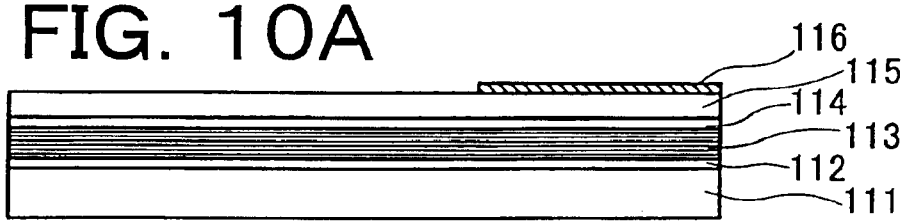
FIG. 10 shows cross sections of a device according to the second embodiment of the present invention, illustrating the manufacturing process in a processing order.
Figure 10B:
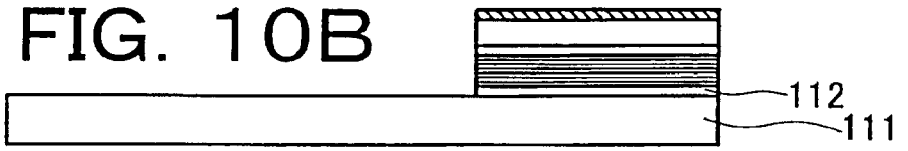

The semiconductor wafer that has this layered structure is clad with SiN, which is formed to a mask 116 that serves to protect the modulator part (FIG. 10A). Using this SiN mask 116, the p-InP cladding layer and the optical absorption layer are etched away (FIG. 10B). The etching is allowed to proceed through the n-type InGaAlAs 112 and is selectively stopped at the n-type InP substrate 111. The etching may be either of: dry etching, for example, reactive ion etching (RIE); selective wet etching that uses a solution whose main constituent is phosphoric acid or sulfuric acid; or a combination of both of these processes.

Figure 10C:
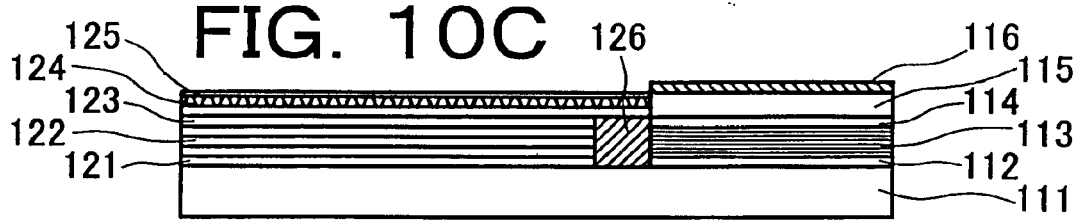
Figure 10D:
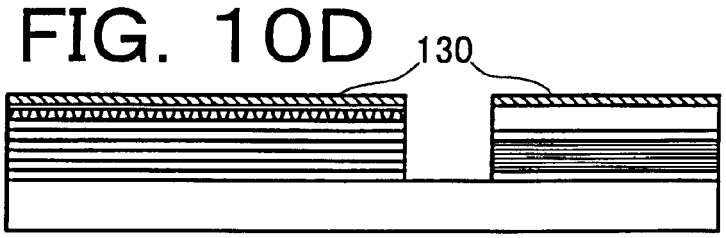

On the n-InP substrate 111 that has been exposed by the etching, an InGaAsP system MOW structure that will act as a laser is formed by a first butt-joint process. The MQW structure is manufactured, in a similar manner to the first embodiment, by depositing an n-type InGaAsP optical confinement layer 121, an undoped active layer 122, an undoped InGaAsP optical confinement layer 123, and additional layers thereon. Then, a grating layer 124 made of an InGaAsP system material and a p-type InP cladding layer 125 are preferably formed (FIG. 10C).

Figure 10E:
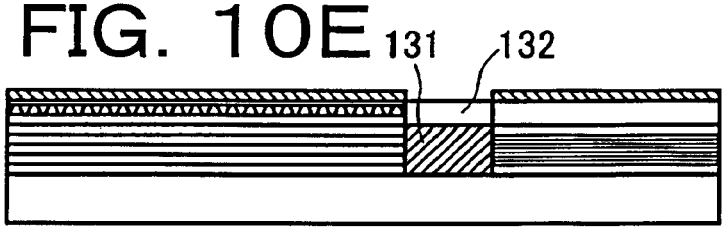
Figure 10F:
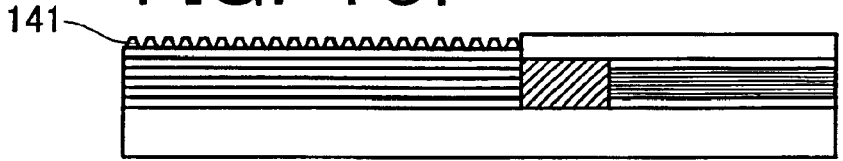

Next, a crystal defect 126 with poor crystallinity that was formed at the connection part between the modulator and the laser is removed using a SiN mask 130 (FIG. 10D) In the removal process, in a similar manner to the first butt-joint process, dry etching such as the reactive ion etching (RIE) and selective wet etching using a solution whose main constituent is phosphoric acid or sulfuric acid are preferably used together. It should be noted that the etching is selectively stopped at the n-type InP substrate 111. After the InP substrate 111 is exposed, an undoped bulk InGaAsP waveguide layer 131 and an undoped InP 132 are deposited thereon as a second butt-joint process (FIG. 10E).

Figure 10G:
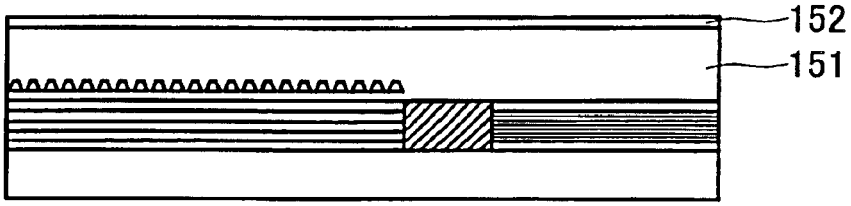

After the two butt-joint processes described above, a grating structure 141 is formed in the laser area by a conventional method (FIG. 10F) on which a p-type InP cladding layer 151 and a p-type InGaAs layer 152 are deposited (FIG. 10G).

Thereafter, a laser structure is constructed through the same process as the first embodiment. As details are the same as described with respect to the first embodiment, further explanation is omitted. FIG. 9 is a cross section of the device taken along a plane intersecting the travelling direction of light therein. In FIG. 9, reference numerals for the p-type InP cladding layer 151 and for the p-type InGaAs layer 152 on the layer 114 are omitted.

Exemplary optoelectronic waveguiding devices according to this embodiment are evaluated for optical output versus current characteristics at an operating temperature of 25 degree C. The results of the tests show that an average threshold current was approximately 8 mA, and the average slope efficiency was 0.17 W/A. An example of the cumulative distribution of slope efficiency was shown in FIG. 6. From FIG. 6, it can be understood that the present invention preferably improves the slope efficiency as compared to conventional devices. Further, exemplary optoelectronic waveguiding devices according to this embodiment are tested in an optical transmission experiment using a single mode optical fiber of a length of 40–80 km, and sufficient transmission characteristics are achieved. Moreover, in an acceleration test for the reliability, an estimated life exceeding 200,000 hours is successfully secured.

Third Exemplary Embodiment

Figure 11:
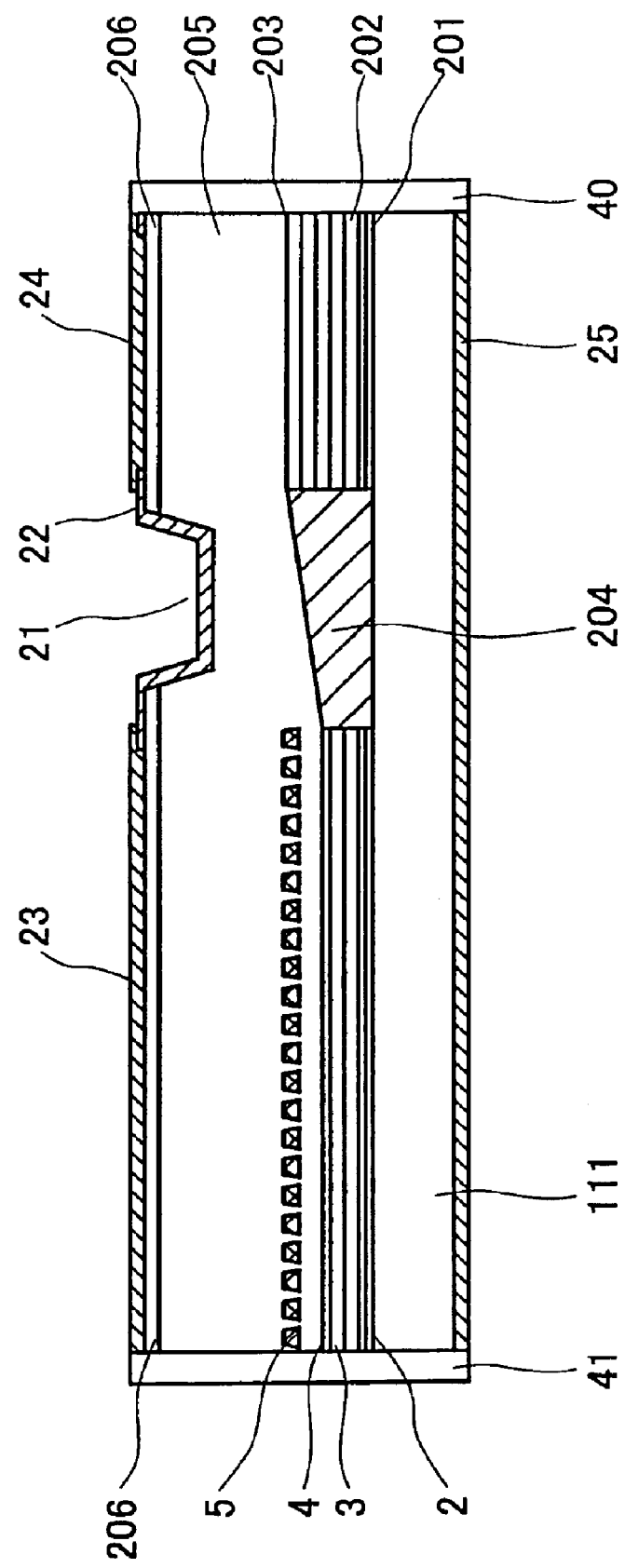
FIG. 11 is a cross section of a device according to a third embodiment of the present invention, taken along a plane parallel to the travelling direction of light therein.
Figure 13:
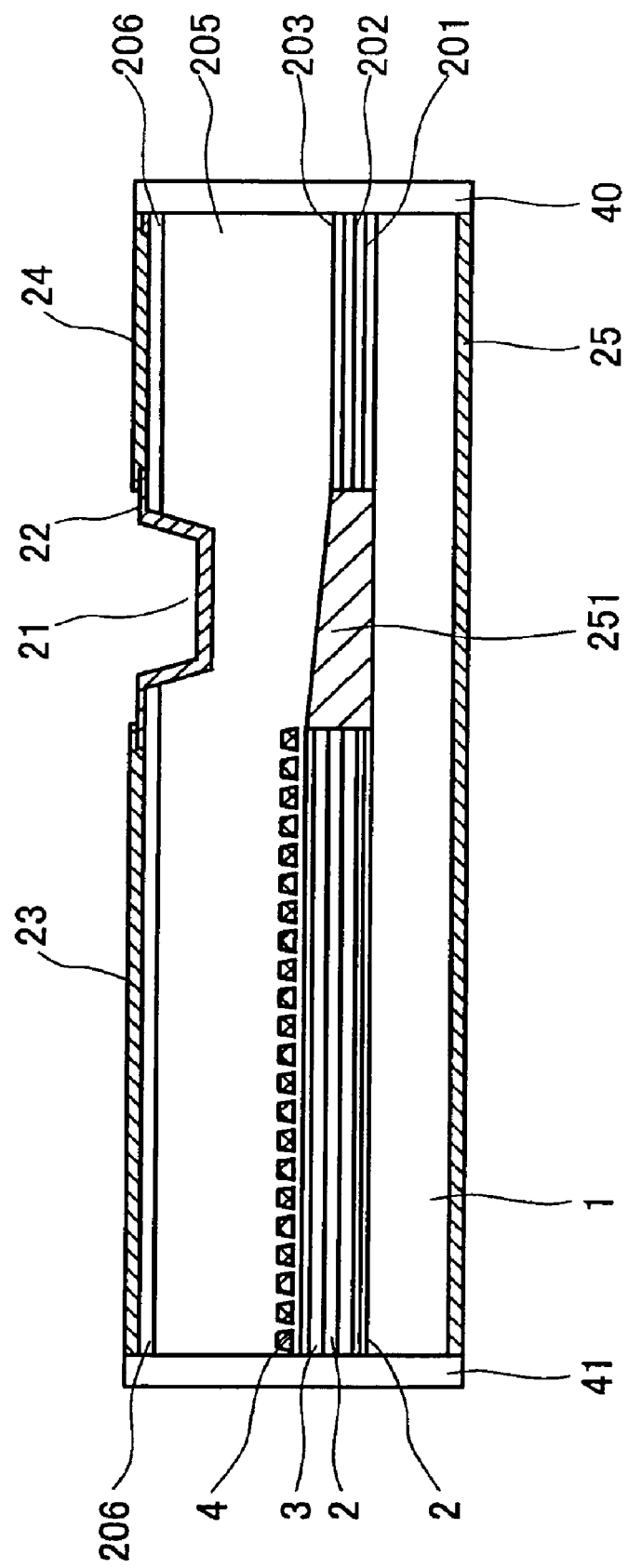
FIG. 13 is a cross section of a device according to a fourth embodiment of the present invention, taken along a plane parallel to the travelling direction of light therein.

As a third exemplary embodiment of the present invention, as applied to a 1.55 μm band EA modulator integrated distributed feedback semiconductor laser, examples in which the bulk crystal waveguide provided at the connection part between the EA modulator and the laser has a mode-conversion function are shown in FIG. 11 and FIG. 13. These address the potential problem of mode mismatching between the waveguides in cases where the EA modulator part and the laser part have different waveguide layer thicknesses, and therefore, the guided mode size of light in the respective areas differ from each other.

Figure 12:
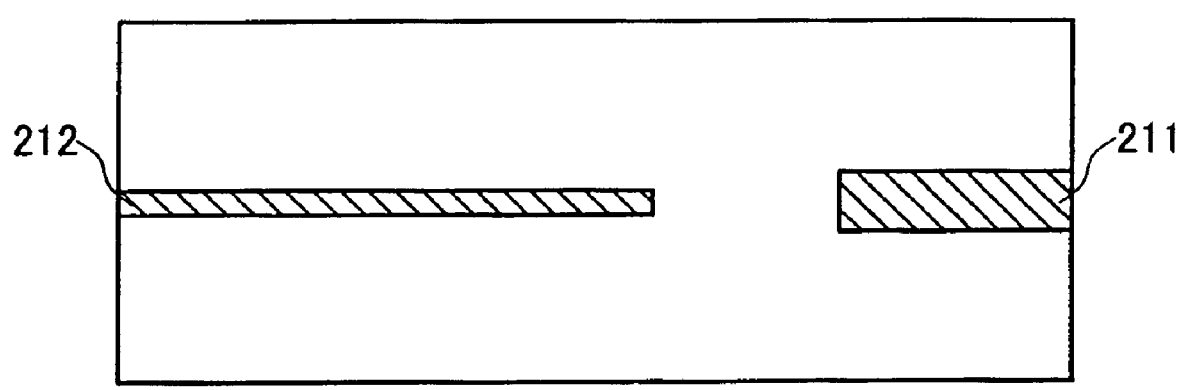
FIG. 12 is a view showing an example of a mask pattern to be used to form a bulk crystal waveguide of a device according to the third embodiment of the present invention shown in FIG. 11.

The exemplary embodiment illustrated in FIG. 11 is an example in which the length of the modulator is shortened with the intention of improving the operating frequency band thereof. That is, by shortening the modulator length of the modulator, the electric capacitance can be reduced, and the modulation bandwidth of the device can be improved. In this example, the thicknesses of several layers that constitute the optical modulator are set to be larger than those of the corresponding layers of the laser part. FIG. 11 is a cross section of the device taken along a plane parallel to the travelling direction of light therein, and FIG. 12 is a top view showing locations and widths of patterns of the protection mask that are used to manufacture respective parts in this example.

Figure 14:
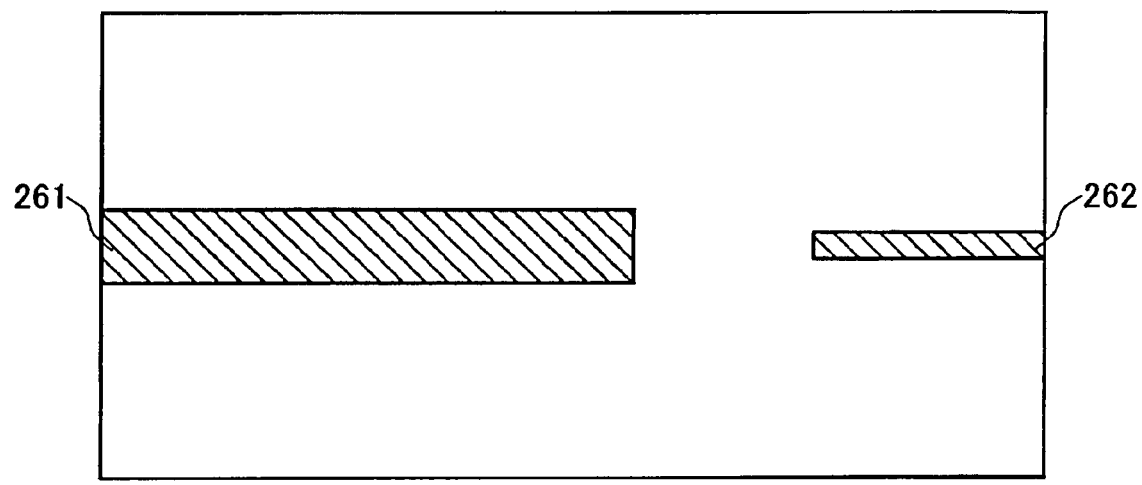
FIG. 14 is a view showing an example of a mask pattern to be used to form a bulk crystal waveguide of a device according to the fourth embodiment of the present invention shown in FIG. 13.

In an example shown in FIG. 13, the thicknesses of layers that constitute the optical modulator are set to be smaller than those of the corresponding layers of the laser part. FIG. 13 is a cross section of the device taken along a plane parallel to the travelling direction of light therein, and FIG. 14 is a top view showing locations and widths of patterns of a protection mask that are used to manufacture respective parts of this example.

First, the example of FIG. 11 will be described. In this structure, to achieve a sufficient extinction ratio with a short modulator, the number of the quantum well layers of the EA modulation part was increased, and the optical confinement coefficient in the absorption layer was made larger. Accordingly, the thickness of a waveguide 204 in an area near the EA modulator part is larger than that in an area near the laser part. Also in this embodiment, the modulator part is preferably comprised of the MQW structure of an InGaAlAs system material to realize desired modulation characteristics of the modulator. An exemplary manufacturing process for this embodiment will now be described.

According to the same procedure that is executed in the second embodiment, an optical absorption layer comprises an n-type InGaAlAs optical confinement layer 201, an MQW layer 202, and an undoped InGaAlAs optical confinement layer 203 formed on an n-type InP substrate 111. The quantum well layer acting as a light absorbing layer is repeatedly deposited to approximately 14 cycles which is larger than that of the second embodiment. Accordingly, the absorption layer is thicker than that of the second embodiment by approximately 50 nm.

On this optical absorption layer, a cladding layer of p-type InP is grown to a thickness of about 0.2 μm. On the semiconductor wafer having this layered structure, a SiN mask for protecting the modulator part is formed using the same technique as the second embodiment. Using this SiN mask, the p-InP cladding layer and the optical absorption layer are etched away. The etching is allowed to proceed through the n-type InGaAlAs 201 and is selectively stopped at the n-type InP substrate 111. The etching may be either of: dry etching, for example, reactive ion etching (RIE); selective wet etching that uses a solution whose main constituent is phosphoric acid or sulfuric acid; or a combination of these processes.

Using the above procedure, the surface of the n-type InP substrate 111 is exposed, and an active layer region of the laser is formed on this surface. The structure of the active layer region is the same as in the first and second embodiments. The n-type InGaAsP optical confinement layer 2, the active layer 3, the undoped InGaAsP optical confinement layer 4 are formed, On these layers, the grating layer 5 made of an InGaAsP system material and a p-type InP cladding layer are formed.

Subsequently, in a similar manner to the second embodiment, the crystal defect that was formed at the connection part between the optical modulator and the laser part is replaced with a bulk InGaAsP waveguide 204 by a second butt-joint process. In this embodiment, the mask pattern to be used in this second butt-joint process is such that the width of a mask stripe pattern on the optical modulator side is set to be larger than that on the laser side. By the selective use of stripe pattern widths in the process of bulk crystal growth of a compound semiconductor material, the bulk semiconductor layers can be tailored to be thicker near the modulator than near the laser. Thus, as illustrated in FIG. 11, the waveguide made of the bulk compound semiconductor can be manufactured with a tapered structure.

Also in the process of removing the MQW structure using the above-mentioned mask, in a similar manner to the first butt-joint process, it is recommended that the dry etching such as the reactive ion etching (RIE) and the selective wet etching that uses a solution whose main constituent is phosphoric acid or sulfuric acid are used together. The etching is selectively stopped at the n-type InP substrate 111. After the n-InP substrate 111 is exposed, the undoped bulk InGaAsP waveguide layer 112 and an undoped InP are preferably deposited as a second butt-joint process.

As described above, in the second butt-joint growth process, if the width of a mask 211 on the EA modulator side is set to be larger than the width of a mask 212 for protecting the laser part, the well-known effect of the selective area growth occurs. That is, since the quantity of the growth species supplied becomes large near the EA modulator side, the crystal that is grown there in the second butt-joint process becomes thicker than that near the laser side. Accordingly, the InGasP waveguide layer 204 tends to be thicker closer to the modulator side than at a point near the laser side.

As a result, the thickness of the waveguide can be varied in a taper manner so that the thickness of the waveguide near the laser side equals the thickness of the waveguide of the laser and the waveguide near the EA modulator side equals the thickness of the absorption layer. Thus, any discontinuity of the waveguide thickness may be eliminated both at the connection part between the laser part and the InGaAsP bulk crystal waveguide and at the connection part between the optical modulator and the InGaAsP bulk crystal waveguide. Therefore, the propagation loss of light between the waveguides is decreased.

After the second butt-joint process is completed according to the above-mentioned procedure, a grating structure is formed in the laser area by a conventional technique, and a p-type InP cladding layer 205 and a p-type InGaAs layer 206 are deposited thereon. Subsequently, the laser structure is formed through the same process that is described with respect to the first embodiment. Previously described details are again omitted.

Moreover, the above-mentioned description is for the case where the waveguide thickness of the EA modulator portion is larger than that of the laser part, but the present invention can be applied to a converse case (shown in FIG. 13) where the waveguide thickness of the EA modulator part is smaller than that of the laser part. In that case, an optical waveguide 251 of a bulk crystal that is provided between the laser part and the modulator is such that its thickness at the connection part to the laser part is thick and becomes thinner nearer to the modulator.

In the case where the optical waveguide 251 with such a taper shape is formed, a mask pattern as shown in FIG. 14 may be used in the second butt-joint process. That is, the width of a SiN mask 261 (stripe pattern) for protecting the laser side is to be larger than the width of a SiN mask 262 (stripe pattern) for protecting the EA modulator part. The reason that the taper waveguide is formed with such a mask pattern is the same as description of FIG. 12.

Note that in the embodiments shown in FIG. 11 and in FIG. 13, the device manufacturing process is basically the same as the first embodiment excluding alteration of the mask pattern.

Fourth Exemplary Embodiment

Figure 15:
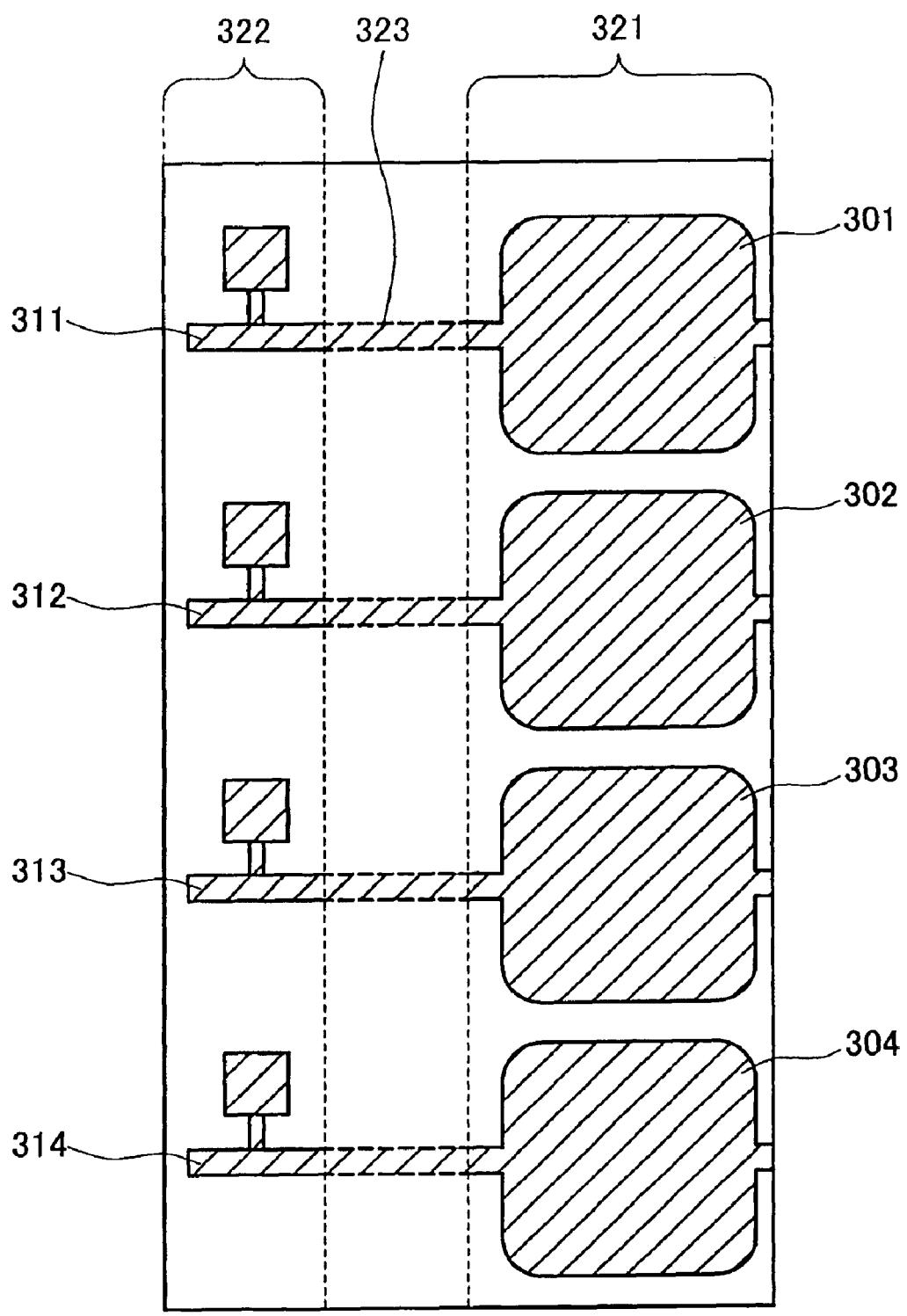
FIG. 15 is a top view of an embodiment that has an array of light emitting device element parts.
Figure 16:
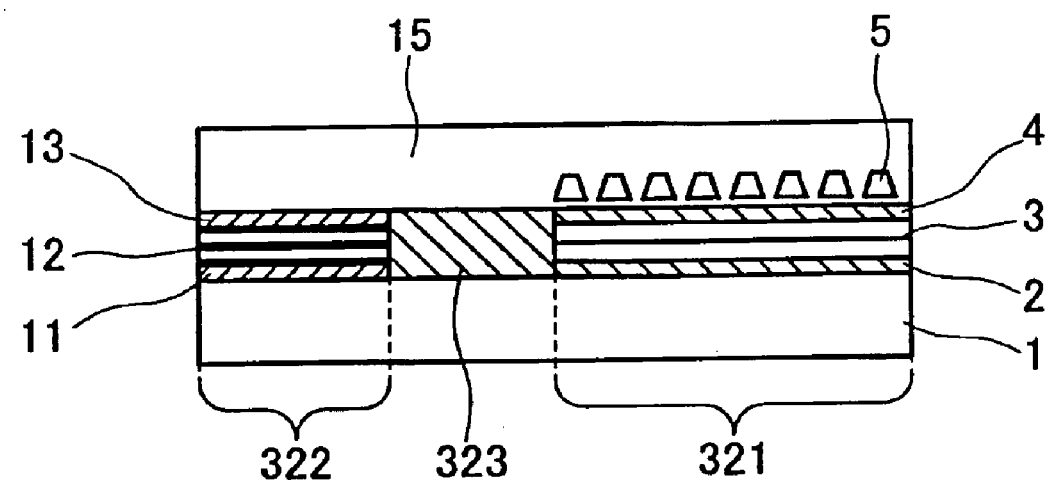
FIG. 16 is a cross section of an embodiment that has an array of the light emitting device element parts, taken along a plane parallel to the travelling direction of light therein.

FIG. 15 and FIG. 16 are examples of the present invention as applied to side-by-side arrangements of the device elements described in the first and/or second embodiments to compose an array of optoelectronic device elements. FIG. 15 is a top view of the device according to this embodiment, and FIG. 16 is a cross section of the device taken along a plane parallel to the travelling direction of light therein. Note that each figure shows only characteristic portions of the device, and portions common to the device according to the present invention (such as the electrodes) are omitted for clarity.

A device with a plurality of modulator-integrated lasers arranged side by side, as in this example, provides a plurality of optical signals to be used with a plurality of transmission channels. Therefore the present invention can provide light sources suitable to a further high-capacity optical transmission system such that the transmission capacity is proportional to a product of the transmission speed and the number of channels.

FIG. 15 shows a top view of the device with four pieces of DFB lasers each acting as a light emitting part arranged side by side, from a first channel laser 301 to a fourth channel laser 304 mounted on its surface. Further, four modulators, from a first channel modulator 311 to a fourth channel modulator 314, are also formed in such a way that each modulator corresponds to one of the DFB lasers. FIG. 16 shows a cross-sectional structure of the optical waveguide of the side-by-side arranged channel device. Each of the four channels has a laser area 321 and a modulator area 322, and a bulk crystal waveguide 323 is formed between these two areas. The formation process for these waveguide structures is preferably the same as that described in the first embodiment.

In this case, there can be expected a decrease in power consumption of the device and of an optical module with the device incorporated therein. This expectation stems from the fact (already discussed in the first exemplary embodiment) that the application of the present invention increases the optical output of each channel by about 2 dB. This increase in output means that a lower amount of electric power is necessary to obtain the same quantity of optical output as a conventional device. In the optoelectronic waveguiding device in which a plurality of device elements are arranged side by side as shown in FIG. 15, power consumption of the entire device is a product of power consumption of each device element and the number of channels. Therefore, the decrease in power consumption for the entire device is a product of the decrease in power consumption for each channel and the number of channels. That is, the device has a greater decrease in power consumption then a single channel device.

Fifth Exemplary Embodiment

Figure 17:
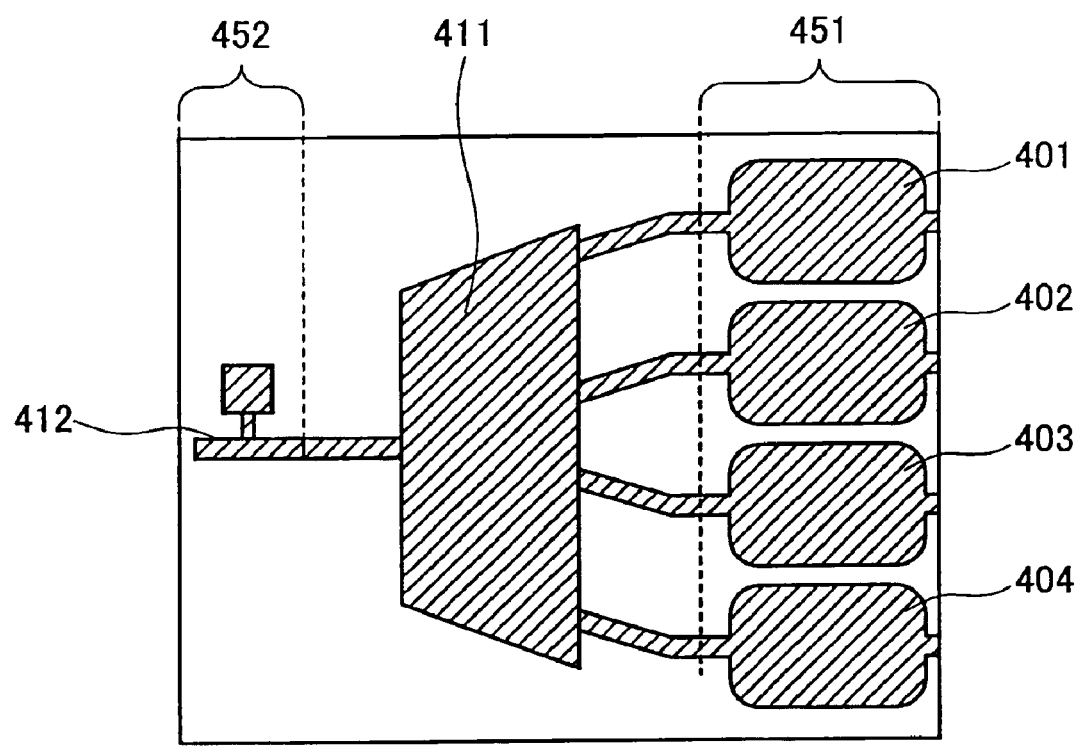
FIG. 17 is a top view of an embodiment that has an array of light emitting device element parts and an optical multiplexer.

Moreover, an embodiment shown in FIG. 17 is an example of the device such that light emitted from one of a plurality of lasers arranged side by side is multiplexed to a single optical waveguide by a multiplexer and then modulated by a single optical modulator. FIG. 17 includes a laser part 451, an optical modulator part 452, and an optical multiplexer part 411, all of which are connected to one another with optical waveguides. Four lasers for four channels, from a first channel laser 401 to a fourth channel laser 404, are arranged side by side. Light generated by any of the four channel lasers is preferably made to enter a single optical modulator 412 through the optical multiplexer 411, and is modulated thereby.

With a device as depicted in FIG. 17, it is possible that a desired wavelength (i.e., one of four wavelengths) is obtained from a single device. In this embodiment, emission wavelengths of the four channel lasers, from the first channel laser 401 to the fourth channel laser 404, are preferably set at different wavelengths with a spacing of approximately 2 nm. Specifically, a device with lasers at frequencies of 1550 nm, 1552 nm, 1554 nm, and 1556 nm, respectively was formed. Adoption of such a side-by-side structure makes it possible to obtain light having a desired wavelength by injecting current to a channel having the desired wavelength according to need. Note that in this embodiment the number of channels and wavelength separation between the channels are set at 4 and 2 nm, respectively, but by setting the number of channels and wavelength separation according to need, the number of selectable wavelengths and a wavelength region can be set in an almost unlimited variety of desired values.

Figure 18:
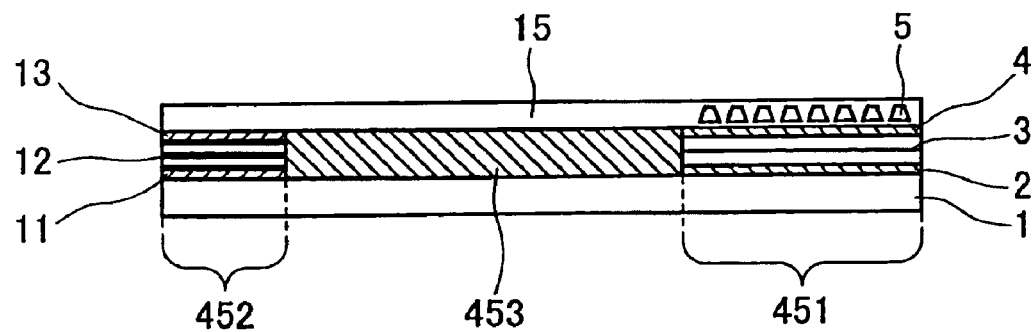
FIG. 18 is a cross section of an embodiment that has an array of light emitting device element parts and an optical multiplexer, taken along a plane parallel to the travelling direction of light therein.

FIG. 18 is an irregular section of the optoelectronic waveguiding device taken along a non-straight line that passes each optical waveguide layers. In order that the laser part 451 and the EA modulator part 452 possess their optimal characteristics, respectively, both device elements preferably have MQW structures. As details of their layered structures are the same as in the first embodiment, further explanation is omitted.

Between the lasers and the FA modulator, namely at a position where the multiplexer is provided, an optical waveguide layer 453 is formed of a bulk crystal having a refractive index distribution desirable as the optical waveguide according to the present invention. In the case where a multiplexer is provided, as in the present embodiment, because the length of the whole device becomes longer, it may be important to limit the optical absorption per unit length in the path. If the light is absorbed in the optical waveguide, optical output emitted from the device becomes small. As a result, after the device is built into an optical transmission apparatus, there may occur a failure that results in deterioration of S/N characteristics of the transmission apparatus. The optical multiplexer itself may be of a conventional structure, and many types of device elements may achieve a sufficient effect.

To reduce optical loss in an optical waveguide, the structure according to the present invention where a bulk crystal waveguide is provided between the laser part and the EA modulator is preferably suitable. As already described, since the bulk crystal waveguide has an absorption edge that is far away from the guided wave wavelength as compared to the MQW waveguide, it is possible to control the waveguide absorption per unit length to be low value. Further, although in the present exemplary embodiment the number of channels is set at 4, if the present invention is applied to a device whose number of channels is other than four, the effect of reducing the loss when the light passes through the multiplexer is the same.

Figure 19:
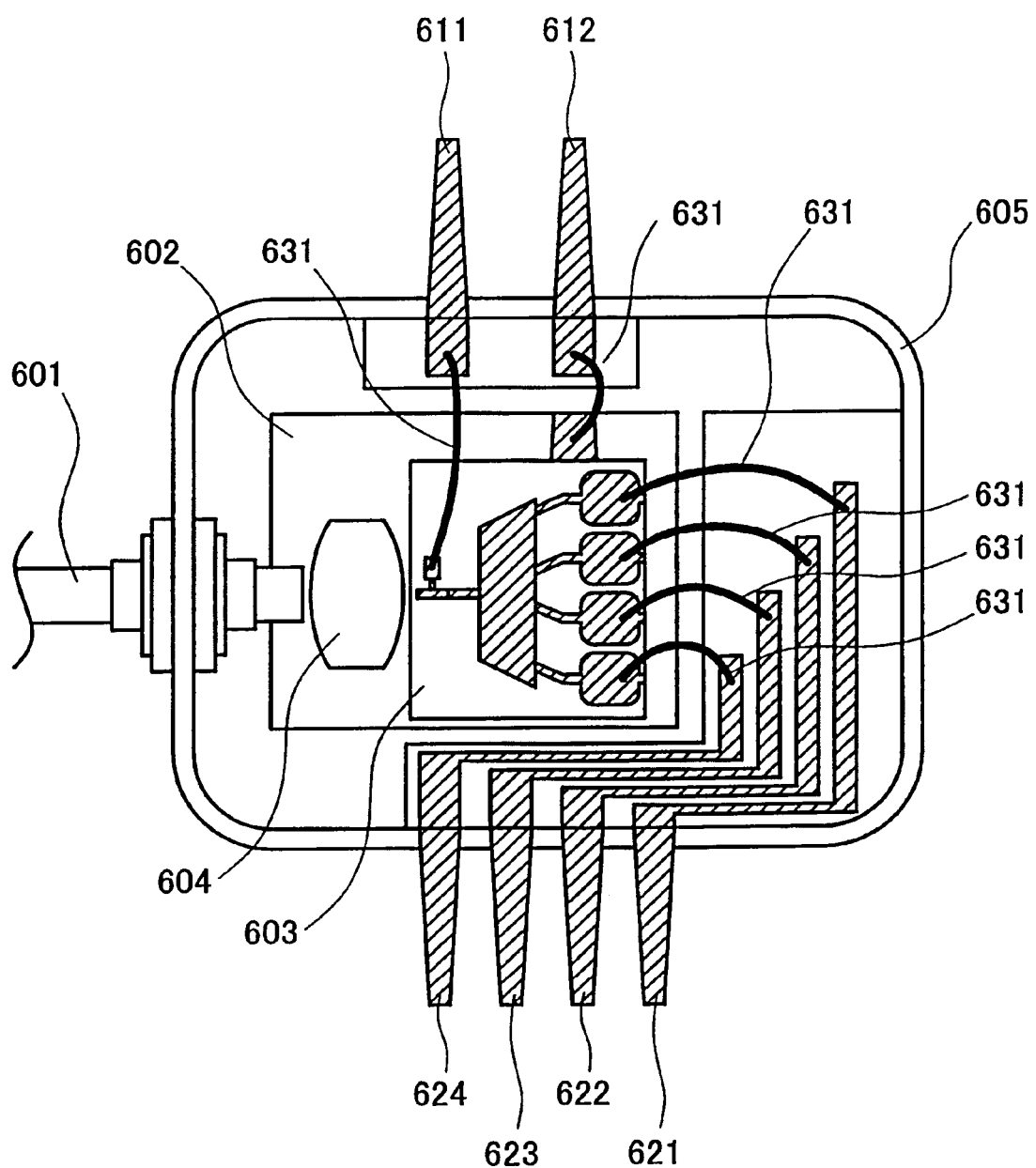
FIG. 19 is a top view showing an optical module that uses the optoelectronic waveguiding device according to the present invention.

A conceptual top view of a mounting form including an optoelectronic waveguiding device according to this embodiment is shown mounted on an optical module in FIG. 19. An optoelectronic waveguiding device 603 is placed on a mount board 602 together with an optical lens 604, and the prepared mount board 602 is then placed in a package 605 and a fiber 601 is connected thereto. Current feed to the device may be accomplished from an electrode pad through a wire in a similar manner to conventional techniques. In FIG. 19, there is shown a feed pad 611 for EA modulator; an n-electrode pad 612 for semiconductor laser; p-electrode feed pads 621, 622, 623, and 624 for DFB laser; and a feed wire 631.

As described in detail in the foregoing, according to the present invention, a modulator-integrated laser that emits large optical output and enables high-speed optical communication can preferably be provided. With the use of the optical module and/or optical transmission apparatus into which the device according to the present invention was built, a high-speed optical transmission system capable of operating at low power consumption can be provided.

Some additional exemplary forms according to the present invention will now be enumerated and briefly described.

(1) An optoelectronic waveguiding device in which a layered structure consisting of an optical waveguide layer having a refractive index desirable for light guiding and cladding layers each of which is made of a material having a refractive index lower than that of the optical waveguide layer that exist above or beneath the optical waveguide is formed on a semiconductor substrate. The device is characterized in that (a) a plurality of optical waveguide layers each having the MQW structure exist in a direction of a light propagation axis of the optical waveguide layer each have layer structures or constituent materials that are mutually different, and (b) an optical waveguide made of a semiconductor bulk crystal that bears a small quantum effect and has a refractive index higher than those of the cladding layers exists at the connection part between these MQW structure waveguides.

(2) An optoelectronic waveguiding device formed by depositing a first MQW structure on a semiconductor substrate, removing a part of the first MQW layer and subsequently forming a second MQW structure in that area. Further, an optical waveguide layer made of a semiconductor bulk crystal material that bears a small quantum effect and has a refractive index higher than those of the cladding layers is deposited thereon.

(3) An optoelectronic waveguiding device, characterized in that a plurality of optoelectronic waveguiding device elements each having a different function are formed in a direction of the light propagation axis on the same semiconductor substrate. In these optoelectronic waveguiding device elements, cladding layers are each made of a material having a refractive index lower than that of the optical waveguide layer being deposited above and beneath the optical waveguide layer, and some or all of the optoelectronic waveguiding device elements have the MQW structures. At the connection part between the optoelectronic waveguiding device elements, an optical waveguide exists that is formed by depositing a semiconductor bulk crystal bearing an extremely small quantum effect.

(4) An optoelectronic waveguiding device that has at least a semiconductor laser part and an optical modulator in a portion thereof, characterized in that both the optical modulator and the semiconductor laser part have the MQW structures, layer structures or constituent materials of these MQW structures are mutually different, and an optical waveguide made of a bulk crystal exists at the connection part between the optical modulator and the semiconductor laser part.

(5) An optoelectronic waveguiding device, characterized in that optoelectronic waveguiding device elements each of which is one optoelectronic waveguiding device element selected from a group consisting of at least a semiconductor laser, an optical modulator, and a semiconductor optical amplifier are formed on the same semiconductor substrate. These optoelectronic waveguiding device elements are arranged in a direction of the light propagation axis with at least the optical modulator and the semiconductor laser part having the MQW structures. Layer structures or constituent materials of these MQW structures are mutually different. An optical waveguide that is formed by depositing a semiconductor bulk crystal bearing an extremely small quantum effect exists at the connection parts between two of the optical modulator, the semiconductor laser, and the semiconductor amplifier.

(6) An optoelectronic waveguiding device, characterized in that (a) a plurality of device element structures each comprising at least a semiconductor laser and an optical modulator are formed side by side in a direction parallel to the light propagation axis on the same semiconductor substrate, each device element structure capable of emitting light of the same or a mutually different wavelength. Both the optical modulator and the semiconductor part having the MQW structures, respectively, and layer structures or constituent materials of these MQW structures being mutually different. An optical waveguide made of a bulk crystal may exist at the connection part between the modulator and the semiconductor laser part.

(7) An optical module that has at least a semiconductor optoelectronic waveguiding device and an optical fiber as constituents in a portion thereof, characterized in that said semiconductor optoelectronic waveguiding device is a semiconductor optoelectronic waveguiding device such that a plurality of device element structures each comprising at least a semiconductor laser and an optical modulator are formed side by side in a direction parallel to the light propagation axis. Each device element structure being capable of emitting light of the same or a mutually different wavelength. The optical modulators and the semiconductor laser parts all having the MOW structures, and layer structures or constituent materials of these MQW structures of each device element structure are mutually different. An optical waveguide made of a bulk crystal exists at the connection part between the modulator and the semiconductor laser of each device element structure.

(8) An optoelectronic waveguiding device, characterized in that a plurality of device element structures each having at least a semiconductor laser are formed side by side in a direction parallel to the light propagation axis on the same semiconductor substrate and at least an optical multiplexer and an optical modulator are arranged in the optical waveguide running from the semiconductor lasers up to a light facet of the device. The semiconductor lasers, the optical multiplexer, and the optical modulator being configured so that light emitted from the lasers arranged side by side is multiplexed to one optical waveguide and subsequently made to enter the optical modulator.

(9) An optical module comprising at least an optical fiber and a semiconductor optoelectronic waveguiding device capable of emitting single longitudinal mode light in a portion thereof, characterized in that (a) a plurality of device element structures each having at least a semiconductor laser are formed side by side in a direction parallel to the light propagation axis on the same semiconductor substrate, each device element structure in a side-by-side arrangement being capable of emitting light of the same or a mutually different wavelength, (b) at least an optical multiplexer and an optical modulator are arranged in the optical waveguides running from the semiconductor lasers up to a light emitting facet of the device, the optical multiplexer and the optical modulator being configured in such a way that light emitted from any of the lasers in a side-by-side arrangement is multiplexed by the optical multiplexer and then made to enter the optical modulator, and at least modulator part having the MQW structure, and (c) an optical waveguide made of a bulk crystal exists at least in a portion of each waveguide in the optical multiplexer, hence being capable of emitting light having one of plural wavelengths to the outside of the module.

(10) An optoelectronic waveguiding device, characterized in that the MQW structure made of an InGaAlAs system material and the MQW structure made of an InGaAsP system material exist on the light propagation axis of the optoelectronic waveguiding device, and an optical waveguide made of one crystal selected from among InGaAsP system, InGaAlAs system, and InAlAs system bulk crystals exist at the connection part between these two MQW structures.

(11) An optoelectronic waveguiding device that has at least a semiconductor laser and an optical modulator (EA modulator) in a portion thereof, characterized in that a layered structure that constitutes the EA modulator comprises the MQW structure made of an InGaAlAs system material, a layered structure that constitutes the semiconductor laser comprises the MQW structure made of an InGaAsP system material, and an optical waveguide made of one material selected from among InGaAsP system, InGaAlAs system, and InAlAs system bulk crystals exists at the connection part between the modulator and the semiconductor laser.

(12) An optoelectronic waveguiding device that has at least a semiconductor laser and an optical modulator (EA modulator) in a portion thereof, characterized in that each of the EA modulator and the semiconductor laser has the MQW structure made of an InGaAsP system material, at least one of a thickness of the quantum well, a thickness of the barrier layer, and the number of cycles of the quantum wells which constitute the MQW structure of the modulator being different from a counterpart of the MQW structure of the laser part, and an optical waveguide made of one material selected from among InGaAsP system, InGaAlAs system, and InAlAs system bulk crystals exists at the connection part between the modulator and the semiconductor laser.

(13) An optoelectronic waveguiding device that has at least a semiconductor laser and an optical modulator (EA modulator) in a portion thereof, characterized in that each of the EA modulator and the semiconductor laser has a MQW structure made of an InGaAlAs system material, one of a thickness of the quantum well, a thickness of barrier layer, and the number of cycles of the quantum well which constitute the MQW structure of the modulator is different from a counterpart of the MQW structure of the laser part, and an optical waveguide made of one material selected from among InGaAsP system, InGaAlAs system, and InAlAs system bulk crystals exists at the connection part between the modulator and the semiconductor laser part.

Nothing in the above description or provided examples is meant to limit the present invention to any specific materials, geometry, or orientation of elements. Many part/orientation substitutions are contemplated within the scope of the present invention and will be apparent to those skilled in the art. The embodiments described herein were presented by way of example only and should not be used to limit the scope of the invention.

Although the invention has been described in terms of particular embodiments in an application, one of ordinary skill in the art, in light of the teachings herein, can generate additional embodiments and modifications without departing from the spirit of, or exceeding the scope of, the claimed invention. Accordingly, it is understood that the drawings and the descriptions herein are proffered by way of example only to facilitate comprehension of the invention and should not be construed to limit the scope thereof.

What is claimed is:

1. A method for manufacturing an optoelectronic waveguiding device, comprising the steps of:

forming a first optoelectronic device element on a semiconductor substrate;

applying a first resist layer to said first optoelectronic device element;

etching said first optoelectronic device element;

forming a second optoelectronic device element in said etched area on said semiconductor substrate;

applying a second resist layer;

etching said second resist layer to remove a crystal defect formed between said first and second optoelectronic elements; and forming a waveguide from a bulk crystal in said etched crystal defect area, wherein said waveguide from a bulk crystal optically connects said first and second optoelectronic elements.

2. The method of claim 1, wherein said first and second optoelectronic elements include MQW structures.

3. A method for manufacturing an optoelectronic waveguiding device, comprising the steps of:

forming a first layered structure on a substrate, said first layered structure comprising a first optical confinement layer, a first MQW layer, and a second optical confinement layer;

forming a protection mask on or over said first layered structure in part which should become a first optoelectronic device element;

etching other than part where said protection mask has been formed, and thereby etched said first layered structure comprising a first optical confinement layer, a first MQW layer, and a second optical confinement layer at said other than part;

forming a second layered structure on said substrate which exposed by said selective etching process, said second layered structure comprising a third optical confinement layer, a second MQW layer, and a forth optical confinement layer, and said second layered structure being formed by a first butt-joint process;

forming a second mask that has an opening on said second layered structure in the vicinity of said first butt-joint portion, and removing said second layered structure which is not masked and is exposed, and then exposing said substrate; and forming an third optical waveguide made of a bulk crystal over said substrate at said opening, wherein each a first and second optical waveguides in said at least said first and second layered structures are connected to each other with said third optical waveguide.

4. A method for manufacturing an optoelectronic waveguiding device according to claim 3, wherein said first layered structures is a laser part and said second layered structure is a modulator part.

5. A method for manufacturing an optoelectronic waveguiding device according to claim 3, wherein said first layered structures is a modulator part and said second layered structure is a laser part.

* * * * *